US007057152B2

(12) United States Patent
Gondo et al.

(10) Patent No.: US 7,057,152 B2
(45) Date of Patent: Jun. 6, 2006

(54) PHOTOELECTRIC SENSOR HAVING SENSITIVITY ADJUSTMENT DEVICE

(75) Inventors: Kiyohiko Gondo, Fukuchiyama (JP);
Takashi Kamei, Maizuru (JP);
Hiroyuki Inoue, Fukuchiyama (JP);
Shinichiro Iura, Fukuchiyama (JP);
Kizuku Fujita, Ayabe (JP); Yoshinori Kawai, Ayabe (JP)

(73) Assignee: OMRON Corporation, Kyoto (JP)

( * ) Notice: Subject to any disclaimer, the term of this patent is extended or adjusted under 35 U.S.C. 154(b) by 222 days.

(21) Appl. No.: 10/657,711

(22) Filed: Sep. 9, 2003

(65) Prior Publication Data
US 2004/0124337 A1 Jul. 1, 2004

(30) Foreign Application Priority Data
Sep. 11, 2002 (JP) ............................ P2002-266086

(51) Int. Cl.
*H01J 40/14* (2006.01)
(52) U.S. Cl. .................................. 250/221; 250/214 R
(58) Field of Classification Search ................ 250/221, 250/214 R
See application file for complete search history.

(56) References Cited
U.S. PATENT DOCUMENTS

| 5,281,810 | A | 1/1994 | Fooks et al. | |
|---|---|---|---|---|
| 6,211,754 | B1 | 4/2001 | Nishida et al. | |
| 6,211,784 | B1 * | 4/2001 | Nishide | 340/568.1 |
| 6,228,775 | B1 | 5/2001 | Coburn et al. | |
| 6,489,603 | B1 | 12/2002 | Giovannardi | |
| 6,642,502 | B1 * | 11/2003 | Iwaki | 250/214 R |

2002/0104956 A1   8/2002   Okamoto

FOREIGN PATENT DOCUMENTS

| DE | 696 23 830 | 10/2002 |
|---|---|---|
| EP | 0 724 258 B1 | 7/1996 |
| JP | 5-206820 | 8/1993 |
| JP | 07-030398 | 1/1995 |
| JP | 8-340242 A | 12/1996 |
| JP | 9-252242 | 9/1997 |
| JP | 11-225057 A | 8/1999 |
| JP | 2001-124594 | 5/2001 |
| JP | 3255229 B2 | 11/2001 |
| WO | WO 01/77708 A1 | 10/2001 |

OTHER PUBLICATIONS

Kiyoshi Imai et al., "Developmental of E3X-DA-N Optical Fiber Photoelectric Sensor with Auto Power Control Function", Omron Technics, 2001, pages of Japanese language text 7-10, pages of English language 1-6, vol. 41-No. 1.
Takashi Kami, "Integration of a microcomputer with minimized noise [4]", Electro Magnetic Compatibility (EMC), 1997, page of Japanese language text 45-50, pages of English language text 10-11, vol. 9-No. 10.

* cited by examiner

*Primary Examiner*—Que T. Le
(74) *Attorney, Agent, or Firm*—Foley & Lardner LLP

(57) ABSTRACT

A photoelectric sensor has a light projection unit having a light emission element for emitting detection light to a detection region; a light reception unit having a light reception element receiving light from the detection region to obtain a detection value corresponding to an amount of received light; a target value storage unit for storing an adjustment target value for a detection value; a sensitivity adjustment unit for adjusting a power of the detection light emitted from the light projection unit and/or a conversion factor from the amount of received light in the light reception unit to the detection value, thereby matching the detection value with the target value; and an adjustment instruction unit for instructing execution of adjustment to the sensitivity adjustment unit.

11 Claims, 17 Drawing Sheets

Fig. 11
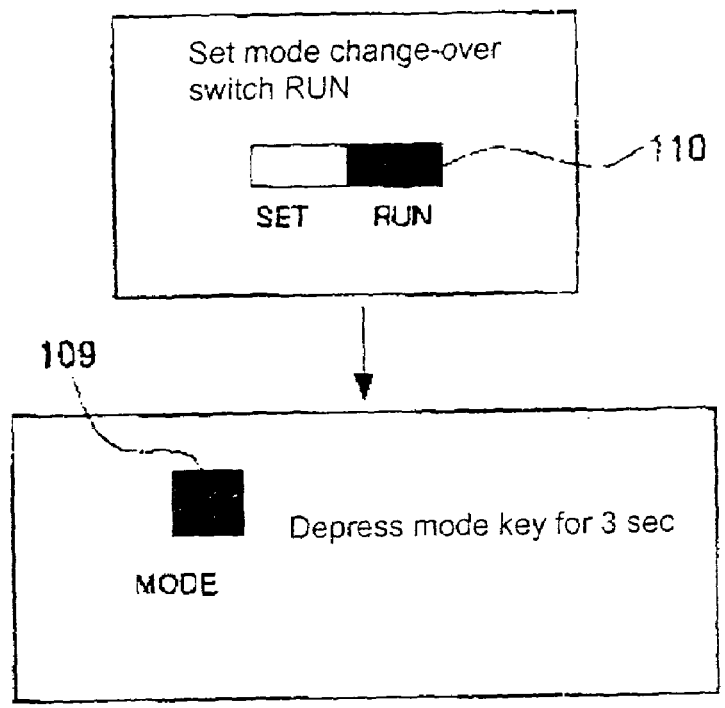
Fig. 11A Activation operation procedure for automatic sensitivity setting process
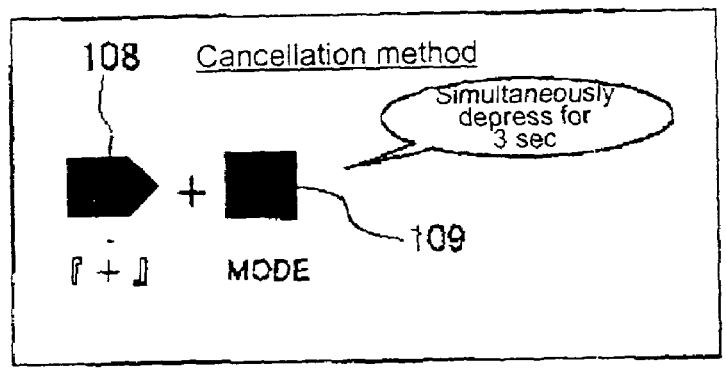
Fig. 11B Sensitivity setting cancellation operating procedure Fig. 13
[When sensitivity adjustment can be normally set] 105    106
Fig. 13A
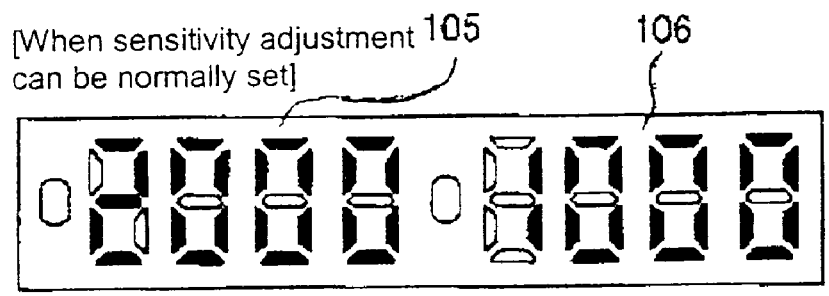
[Over error] 105    106
Fig. 13B
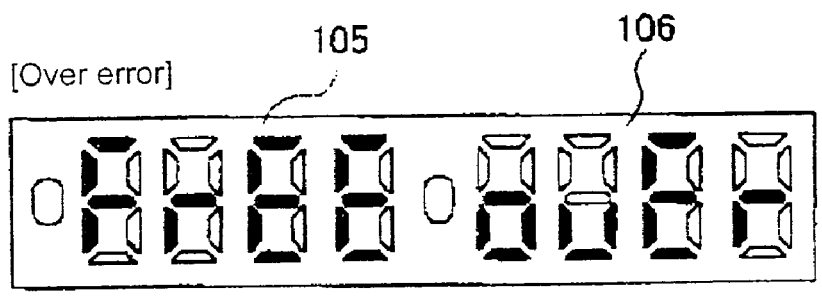
[Bottom error] 105    106
Fig. 13C
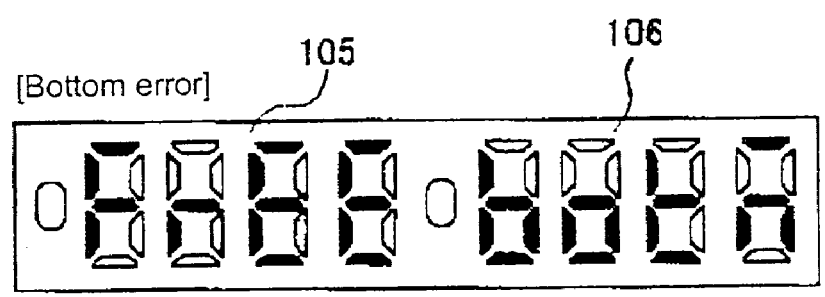
[When sensitivity adjustment is cancelled] 105    106
Fig. 13D
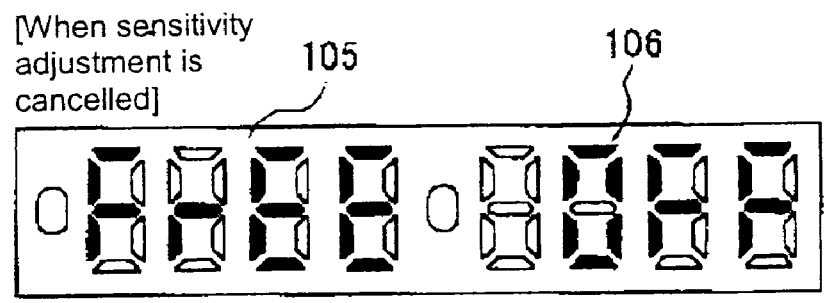

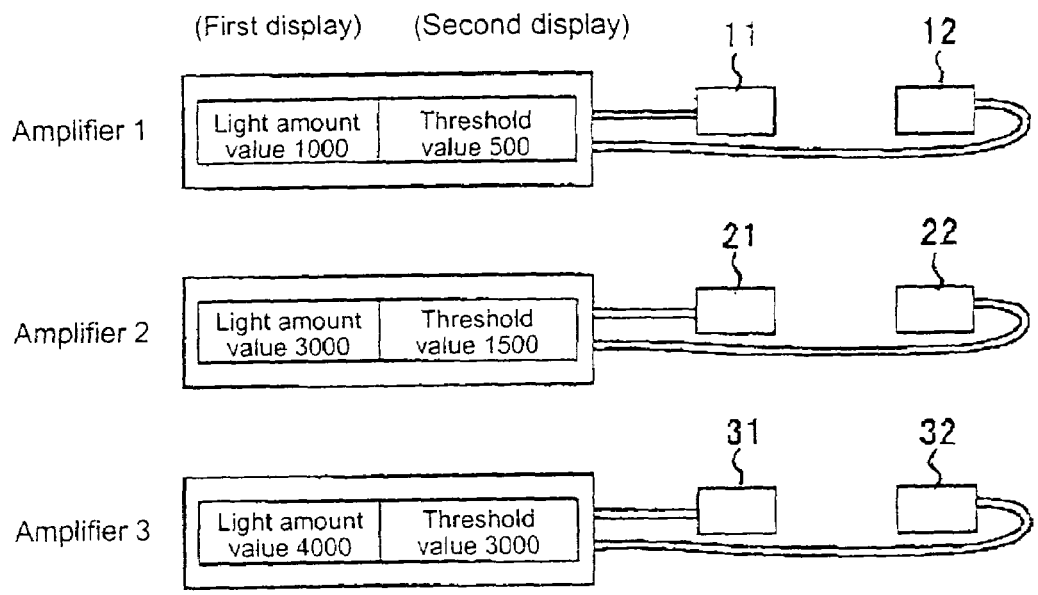
Fig. 15A Conventional scheme
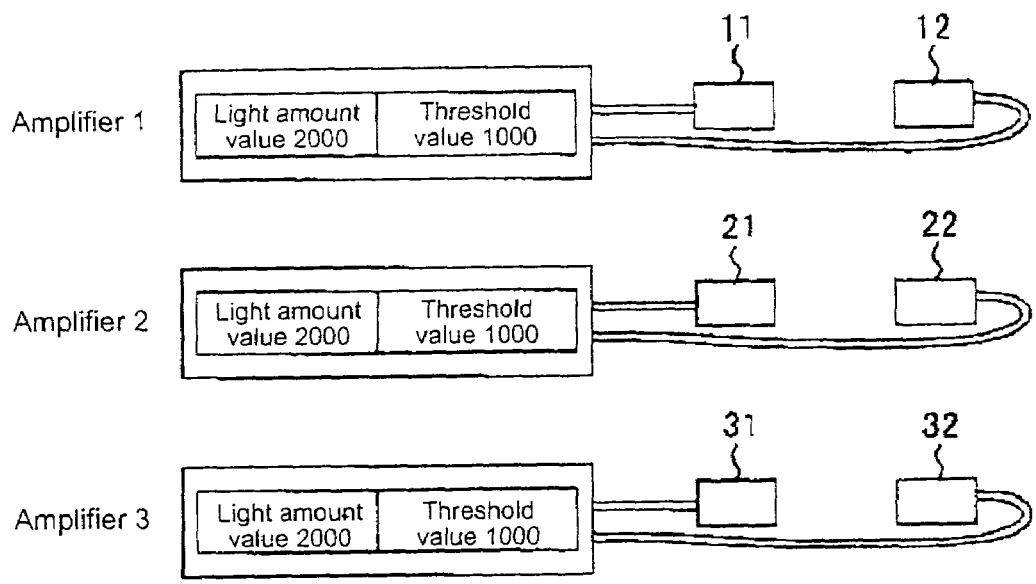
Fig. 15B Scheme of the present Invention Fig. 16
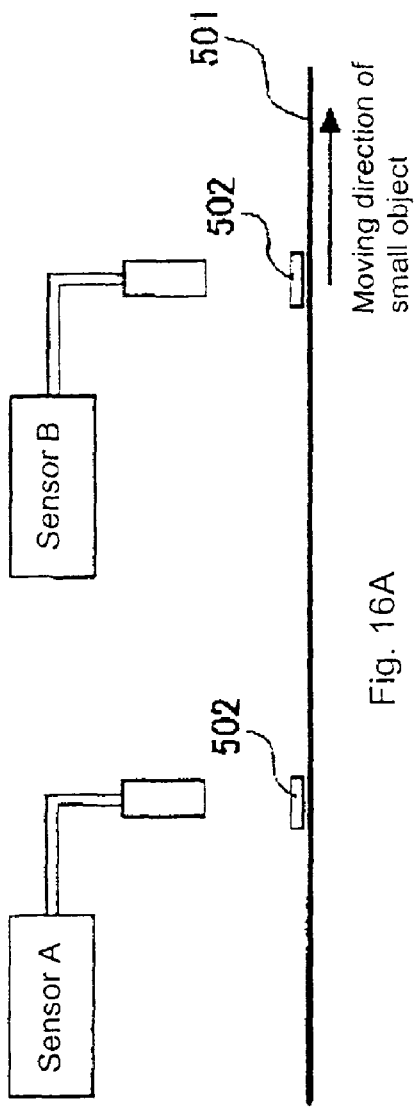
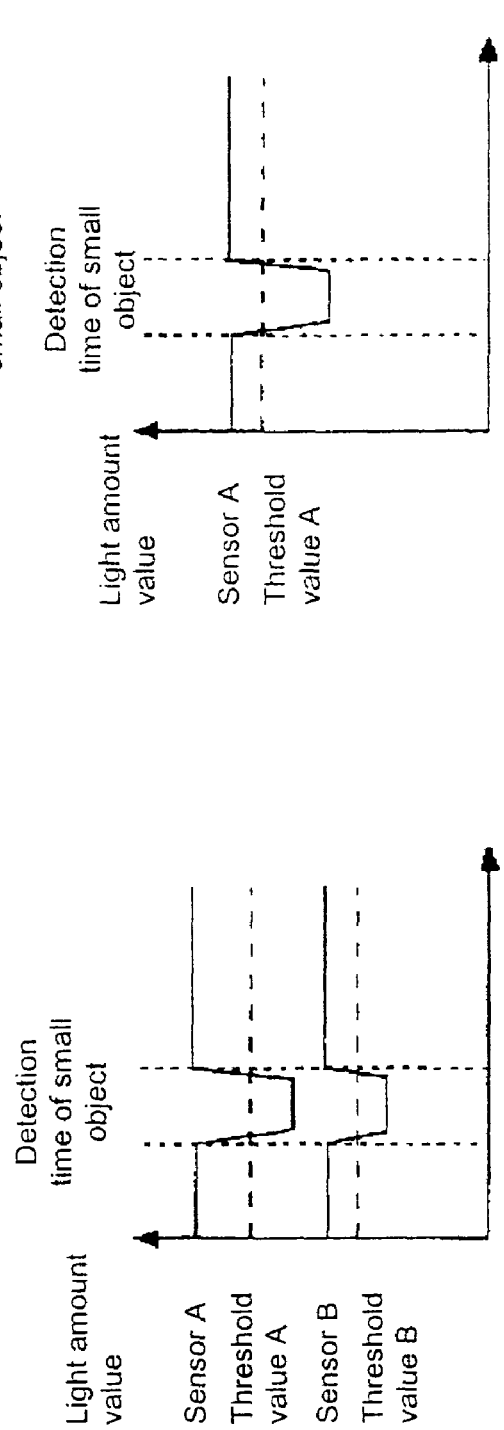

Fig. 17
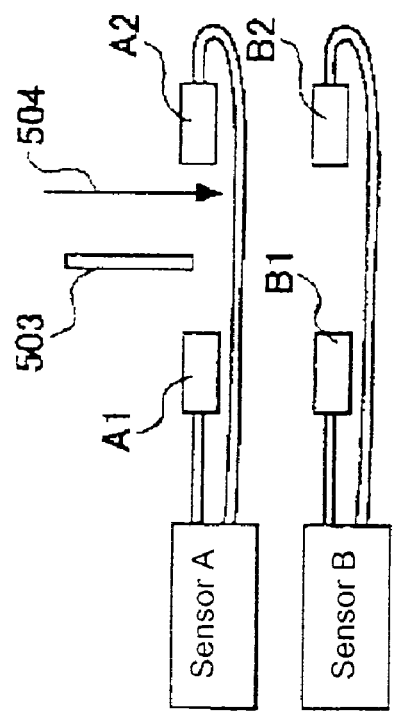
Fig. 17A
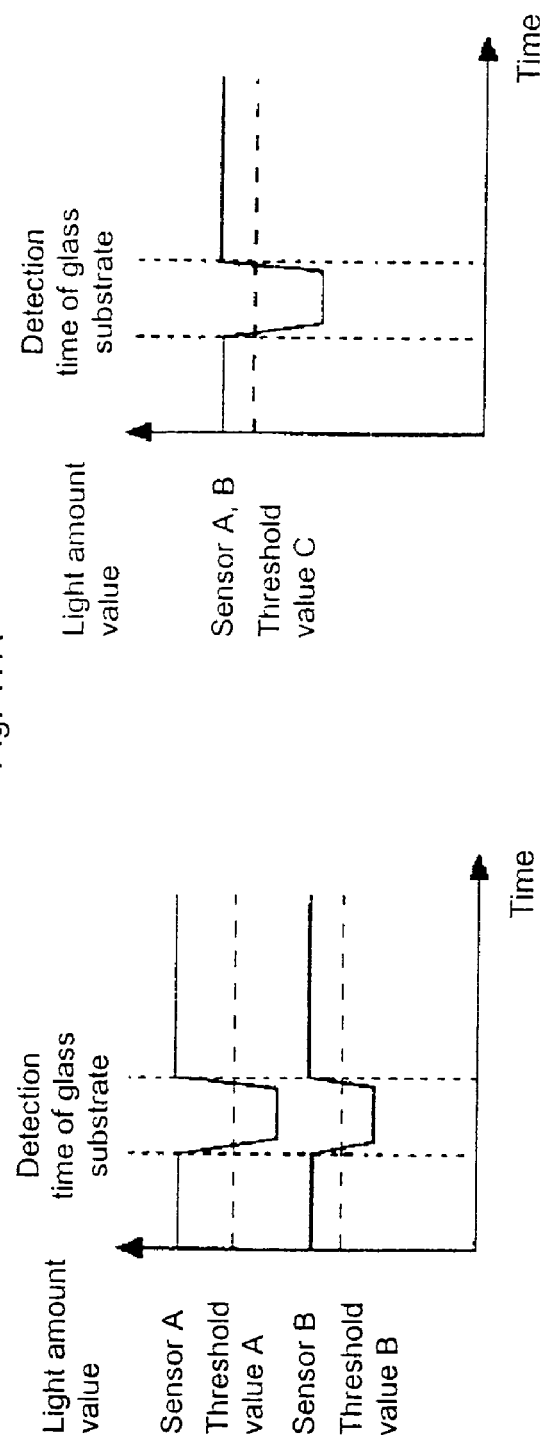
Fig. 17B
Conventional scheme
Fig. 17C
Scheme of the present invention

PHOTOELECTRIC SENSOR HAVING SENSITIVITY ADJUSTMENT DEVICE

CROSS-REFERENCE TO RELATED PATENT APPLICATIONS

BACKGROUND OF THE INVENTION

1. Field of the Invention

The present invention relates to a photoelectric sensor capable of automatically adjusting one or both of a projected light power and a received light conversion factor (for example, a received light amplification factor).

2. Description of the Related Art

A product generally recognized as a photoelectric sensor is categorized as a device which projects light to a detection region, receives light transmitted through the detection region or light reflected by the detection region and acquires information on the presence or absence of an object and, if present, characteristics and geometrical parameters of the object on the basis of an amount of the received light. Since general purpose photoelectric sensors are installed in various conditions and used for various kinds of objects as a detection target, there has been conventionally known a photoelectric sensor wherein adjustments are performed on a projected light power and a received light amplification factor in a situation where a target is actually placed in a detection region to perform sensitivity adjustment thereof so as to obtain a proper detection value and, furthermore, trial detection is performed by altering a position of a detection target, for example, to thereby obtain a detection value and to, on the basis of the detection value, determine a threshold value for discriminating between detection values (see Japanese Unexamined Patent Publication No. 5-206820 (1993), for example).

In such a way, in a photoelectric sensor, determined based on actual data are a sensitivity adapting a situation in a detection region for a detection value, and a threshold value for evaluation and discrimination of an obtained detection value. In order to facilitate the adjustment operations for the determinations, there has been known a photoelectric sensor which displays a detection value and a threshold value in numerical value (see Japanese Unexamined Patent Publication No. 9-252242 (1997), for example).

There has also been known a photoelectric sensor of which a background level is stored as a zero reset reference value to display a remainder obtained by subtracting the zero reset reference value from a detection value in order to ensure quite obvious recognition of whether a displayed detection value corresponds to the background or to a detection target itself, wherein a detection value that is obtained in a state of background detection, which is not zero, is presented as zero in numerical value display (see Japanese Unexamined Patent Publication No. 2001-124594).

A detection value of a general purpose photoelectric sensor is evaluated as a relative value on an arbitrary scale suitable for a usage situation thereof, which is dissimilar to a case of a measuring instrument having a purpose to display a measured physical value (for example, a distance) using a unit therefor (for example, mm). Various light intensities of received light are observed in respective usage situations. Therefore, a sensitivity to adapt a situation in a detection region for a detection value can be adjusted on the basis of actual data so as to obtain the detection value in a proper range. There are also encountered variations in fabrication parameters and variations in installment conditions. With such circumstances, in a case where plural photoelectric sensors are prepared for use, sensitivities of the respective devices do not coincide with each other, which is generally not required to do so. A threshold value is adjusted on an individual device based on actual data after a sensitivity is determined.

In a case where plural photoelectric sensors are applied in the same usage situation, there has been a desire that after a first one is adjusted based on actual data, the others are adjusted with results from the first one to reduce time and labor. Such a requirement can also occur in a case where multiple photoelectric sensors are used in spatially parallel arrangement or in a case where photoelectric sensors are built in respective mass produced other apparatuses. For conventional photoelectric sensors, in a similar way to adjustment in the case of a photoelectric sensor that has been adjusted in the first place, individual adjustment with time and labor also have had to be conducted on a second photoelectric sensor and the others subsequent thereto.

Even in a case where a single photoelectric sensor is used alone, a case has arisen in which it is insufficient to apply only an automatic adjustment function (a teaching function) for a sensitivity and a threshold value. That is, even if a user of a photoelectric sensor can use the automatic adjustment function for a sensitivity and a threshold value, there still remains a chance for the user to desire manual adjustment of at least a threshold value in order to optimize a detection condition. In a conventional photoelectric sensor, however, a problem has been pointed out that it is left up to the hardware of the device what detection value is obtained as a result of automatic adjustment for a sensitivity that is performed prior to manual adjustment, which makes a manual adjustment operation difficult in spite of the automatic adjustment.

SUMMARY OF THE INVENTION

The present invention has been made in view of the above conventional problems, and it is an object of the present invention to provide a photoelectric sensor which is easy to adjust plural photoelectric sensors including itself so as to have similar detection characteristics and, also, easy to set an evaluation reference such as a threshold value for a detection value in a case where a single photoelectric sensor is used alone.

A photoelectric sensor of the present invention comprises: a light projection unit having a light emission element for emitting detecting light to a detection region; a light reception unit having a light reception element for receiving light from the detection region to obtain a detection value corresponding to an amount of received light; a target value storage unit for storing an adjustment target value for the detection value; sensitivity adjustment means for adjusting a power of the detection light emitted from the light projection unit and/or a conversion factor from the amount of received light in the light reception unit to the detection value, thereby matching the detection value with the target value; and adjustment instruction means for instructing execution of adjustment to the sensitivity adjusting means.

According to a photoelectric sensor of the present invention, by installing the photoelectric sensor in place to instruct execution of sensitivity adjustment with the adjustment instructing means, a detection value obtained at that time is matched with a target value. In a case where plural photoelectric sensors are instructed as to execution of sensitivity adjustment in the same usage situation, no variation comes to be found in detection value among photoelectric sensors.

Not only does no variation come to be found in detection value among the photoelectric sensors in the usage situation but change characteristics in detection value accompanying a change in usage situation (for example, a change in position of a detection target) also becomes common among them. This is because not only does a detection value in sensitivity adjustment become common among the photoelectric sensors, but a detection value when no incident light is available also becomes common among them. Detailed description will be given of the above effects among the plural photoelectric sensors. Only a variation in electric offset of the light reception unit contributes to a variation in detection value (for example, zero) when no incident light is available without contribution of variations in optical elements thereto. Since a variation in electric offset of the light reception unit is generally small, it can be said that a detection value when substantially no incident light is available is common among the photoelectric sensors. The photoelectric sensors share two kinds of common detection values, one of which is a detection value in the usage situation and the other of which is a detection value when no incident light is available, among the change characteristics of a detection value; therefore, almost all of the change characteristics of a detection value are common among the photoelectric sensors. The usage situation herein includes relative positions of a light projection unit and a light reception unit of a photoelectric sensor, and the presence or absence of an object in a detection region and, if present, characteristics and geometrical parameters (such as a position, a shape and a size, and optical characteristics such as reflection and transmission and the like).

Therefore, common evaluation references can be applied to detection values obtained by the photoelectric sensors. The common evaluation references include one or plural threshold values to be compared with detection values, a change rate over time of a detection value, and the like. Means for evaluating a detection value may be built in a photoelectric sensor or provided outside a photoelectric sensor to receive an output of a detection value from the photoelectric sensor.

A photoelectric sensor of the present invention can also be used in a case where there is installed none of other photoelectric sensors used in the same usage situation. In such a case as well, by performing sensitivity adjustment, a detection value at the usage situation can be matched with a target value, which is similar to the case described above. Even if a usage situation is different, the same detection value is obtained if sensitivity adjustment is conducted. Usage methods for a photoelectric sensor, therefore, become easy to be standardized on the side of a user. In a case where a threshold value is manually set, for example, a determination procedure for a threshold value becomes easy to be written in a procedure manual. It is also easy for a user to acquire a skill in an adjustment operation for a photoelectric sensor.

A target value in the present invention can be shared in usage among different usage situations. It is preferable to use the same target value in different usage situations in common thereto as far as the common usage is possible or suitable for. The present invention is to forcibly match a detection value obtained by chance with a target value in a usage situation where a detection value assumed to be correct is absent in essence or indefinitely present. In this respect, sensitivity adjustment in the present invention is different from calibration in a measuring instrument having a purpose to correct an error between a detection value assumed to be correct and an actual detection value. However, none of the following operations is obstructed in usage, for example, to change a target value depending on a type of a usage situation of a transmission type arrangement or a reflection type arrangement for projected light/received light, to change a detection target value in a case where an amount of received light is excessively larger or smaller, and in addition, to change a target value according to reasons only associated with a user.

An adjustment range of a sensitivity for matching a detection value with a target value is preferably tenfold or more and it is more preferably to be 100-fold or more (for example, from 1/20-fold to fivefold relative to a detection value prior to adjustment) in consideration of general versatility as a photoelectric sensor.

A power of detection light emitted from the light projection unit is defined by a height and width of a light pulse in a case of pulse light projection. A power of detection light is also defined by a cycle of a light pulse in a case where a detection value in the light reception unit depends on the cycle of pulse light projection. At least one of the elements defining a power of the detection value is an adjustment target in a case where a power of a detection light pulse projected is adjusted by the sensitivity adjustment means.

The adjustment instruction means can be realized using an operating switch provided to a photoelectric sensor. A configuration can be realized in which a signal instructing execution of adjustment is externally inputted. In a photoelectric sensor of the present invention, an error process may be performed in a case where as a result of execution of sensitivity adjustment, no adjustment to a target value is enabled. Error display can be presented as a sign of an error process to be performed. It can be allowed that sensitivity adjustment is not performed as an error process, or adjustment for predetermined sensitivity is performed.

Photoelectric sensors are, as well known to one skilled in the art, classified into an amplifier built-in type, an amplifier separation type and a fiber type. While even the amplifier built-in type of the reflection arrangement has the effect of the present invention capable of standardizing detection values, all of an optical system and circuits are integrated into a single piece; therefore, a variation among detection values can be suppressed to an extent in the same usage situation at the expense of increase in fabrication cost. In the transmission arrangement, relative positions of projected light and received light are determined by a user regardless of the amplifier built-in type, the amplifier separation type or the fiber type, which is a cause for a variation among detection values uncontrollable on shipment from a factory. In the present invention, a cause for a variation in the transmission arrangement can be absorbed by sensitivity adjustment.

In a preferred embodiment of a photoelectric sensor of the present invention, the sensor can be constructed as the amplifier separation type. An amplifier thereof is housed in a case, in which there are included at least a target value storage unit, sensitivity adjustment means and adjustment instruction means. The amplifier separation type of the reflection arrangement in which relative positions of projected light and received light are fixed, if having a fixed correspondence established between a sensor head (including a light projection element and a light reception element) and an amplifier (including almost all of other circuits than a light projection element, a light reception element and circuits accompanying them), is the same in workings as the amplifier built-in type of the reflection arrangement, whereas, for example, in a case where both units are separately sold in the market without no correspondence therebetween, a way of combination of both units works as a cause for a variation uncontrollable on shipment from a factory. In the present invention, this cause for the variation can be absorbed in sensitivity adjustment, which makes possible a free combination of a sensor head and an amplifier in the reflection amendment together with the effect of the present invention exerted.

In a preferred embodiment of a photoelectric sensor of the present invention, the sensor can be constructed as the fiber type. An amplifier thereof is housed in a case, which includes: a light projection unit and a light reception unit, from which fibers are excluded; a target storage unit; sensitivity adjustment means; and adjustment instruction means. Since in the fiber type, in addition to a variation in sensitivity due to a free combination between a fiber and an amplifier, there are various causes for a variation among detection values originating in a disconnection condition of a fiber, a mounting condition of a fiber to the amplifier (an influence thereof is exerted on an optical coupling efficiency in coupling of a fiber with a light projection element and a receiving element) and a bending condition of a fiber; while in the transmission type, there are various causes for a variation among detection values originating in conducts of a user such as relative positions of a projected light fiber and a received light fiber, it is impossible for a fabricator of photoelectric sensors to remove a variation among detection values in the same usage situation. In the present invention, a cause for a variation among detection values can also be absorbed by sensitivity adjustment in the fiber type.

In a preferred embodiment of a photoelectric sensor of a fiber type, the target value is set or can be set in the middle portion of one third of the range of detection values that can be handled after sensitivity adjustment; therefore, the target value can be used in common with cases of fiber arrangements of a transmission type and a reflection type.

In a case of a fiber arrangement of the transmission type, there is available a usage method performing sensitivity adjustment in a state where no light intercepting object exists. In a case of a fiber arrangement of the reflection type, there is available a usage method performing sensitivity adjustment in a state where the background is detected. That is, sensitivity adjustment in both cases is performed in a state where no detection object exists in a detection region. In such a case of usage, in the transmission arrangement, a detection value in a state where an object is detected is smaller than a target value. In order to perform detection with a high sensitivity, it is advantageous to set a larger target value, which is non-problematical if a target value falls within the middle portion of one third of the range of detection values that can be handled after sensitivity adjustment. On the other hand, in such a case of usage, in the reflection arrangement, a detection value in a state where an object is detected is larger than a target value in more of cases, wherein it is not preferable to set a target value to an excessively higher one, since a higher possibility arises that a detection value is saturated. Since if a reflectance of an object is lower than that of the background, a case arises where a detection value is smaller than a target value, however, it is unpreferable to set a target value to an excessively small value either. Circumstances described above being considered, it is preferable to set a target value within a middle portion of one third of the range of detection values that can be handled after sensitivity adjustment in order that a common target can be used in both cases of fiber arrangements of the transmission type and the reflection type. By doing so, standardization of usage methods for a photoelectric sensor can be further promoted.

In a preferred embodiment, a photoelectric sensor of the present invention further comprises output means for outputting the detection value as an analog signal such as a voltage value or a current value or, alternatively, as a signal showing a digitized numerical value. With such a construction adopted, a detection value standardized by the output means can be outputted, so the value can be freely used outside of a photoelectric sensor.

In a preferred embodiment, a photoelectric sensor of the present invention comprises: threshold value setting means; and comparison means for comparing a threshold value with a detection value. The threshold value setting means herein may be any of an automatic setting type, a manually setting type and a type setting a threshold value by inputting the threshold value through a signal line from outside.

In a preferred embodiment of a photoelectric sensor having threshold setting means, the threshold value setting means is used for manual setting, and the photoelectric sensor further comprises display means for numerically displaying the threshold value. With such a construction adopted, in a case where plural photoelectric sensors are used in the same usage situation, an adjustment method can be used in which a threshold value of a different photoelectric sensor is set with the same threshold value as that obtained in adjustment in a first photoelectric sensor.

In a preferred embodiment of a photoelectric sensor having threshold setting means, the threshold value setting means is used for selecting one of plural threshold values prepared for use in advance, and the photoelectric sensor further comprises display means for displaying which one of the plural threshold values is selected. The display means herein may be means for displaying a threshold value itself or identification information such as a threshold number. With such a construction adopted, a detection value after sensitivity adjustment has been matched with a target value; therefore, threshold value adjustment can be performed without any trouble if preparation is made of some threshold values having a predetermined discrepancies from a target value and one is selected from the group consisting of the some threshold values prepared for use. By doing so, an adjustment procedure for a threshold value is simple and standardization of usage methods for a photoelectric sensor can be further promoted.

In a preferred embodiment, a photoelectric sensor of the present invention comprises target value change means. The change means herein may be a manual change type or a type changing a target value by inputting the target value through a signal line from outside. With such a construction adopted, a current detection value can be changed to a different target value if the current target value cannot be used or is improper in a particular usage situation.

Another aspect of the present invention can be directed to an adjustment method for a photoelectric sensor comprising the steps of: performing sensitivity adjustment in a state where no object exists using the photoelectric sensor having the threshold value setting means described above; and performing threshold value setting so that a threshold value takes a predetermined value after execution of the sensitivity adjustment.

Still another aspect of the present invention can be directed to an adjustment method for a photoelectric sensor comprising the steps of: installing plural photoelectric sensors having the threshold value setting means described above in a predetermined usage situation; performing sensitivity adjustment on the plural photoelectric sensors in a state where no detection object exists; and performing threshold value setting on the plural photoelectric sensors so that all of threshold values of the plural photoelectric sensors takes the same predetermined value after execution of sensitivity adjustment.

With such methods adopted, control of a threshold value and a detection value becomes easy as described above, thereby enabling promotion in standardization of usage methods. In addition thereto, in a case where plural photoelectric sensors are disposed directly side by side and used, a detection value in a state where no detection object exists is matched with a target value by the action of the automatic sensitivity adjusting function; therefore, if the same threshold value is set on the plural photoelectric sensors, an effect is realized that displays in a state where no detection object exists are equalized among the plural photoelectric sensors disposed side by side, which is similar to the zero reset function disclosed previously by the present applicant in Japanese Unexamined Patent Publication No. 2001-124594.

Note that while if a target value is set 2000, for example, for a photoelectric sensor of the present invention, a detection value is adjusted to a value of 2000 by the action of the automatic sensitivity adjusting function, and thereafter, by applying the zero reset function described above to a detection value subjected to automatic adjustment, the number of 2000 is subtracted from the detection value with the result that a final detection value becomes zero, which is different from the number of 2000, which is a target value. It is added here, to make double sure, that the present invention also include, as an embodiment, a case where though the automatic sensitivity adjusting function is acted in such a way, the zero reset function is exerted thereafter to obtain the final detection value different from the target value.

BRIEF DESCRIPTION OF THE DRAWINGS

FIGS. 11A and 11B are representations for describing an operating procedure associated with automatic sensitivity setting;

FIGS. 13A to 13D are representations for showing display examples associated with automatic sensitivity setting;

FIGS. 15A and 15B are representations for describing light amount values for the same detection target of a conventional scheme and a scheme of the present invention by comparison;

FIGS. 16A to 16C are representations showing light amount values obtained by a conventional scheme and a scheme of the present invention in a case where a small object carried on a conveyor is detected with two reflection type fiber sensors by comparison; and FIGS. 17A to 17C are representations showing light amount values obtained by a conventional scheme and a scheme of the present invention in a case where a liquid crystal substrate carried on a conveyor is detected with two transmission type fiber sensors by comparison.

DETAILED DESCRIPTION OF THE PREFERRED EMBODIMENTS

Detailed description will be given of an embodiment of a photoelectric sensor pertaining to the present invention below with reference to the accompanying drawings. Note that the embodiment described below is only an example of the present invention and needless to say that the scope of the present invention is specified only by the scope of appended claims.

Figure 1:
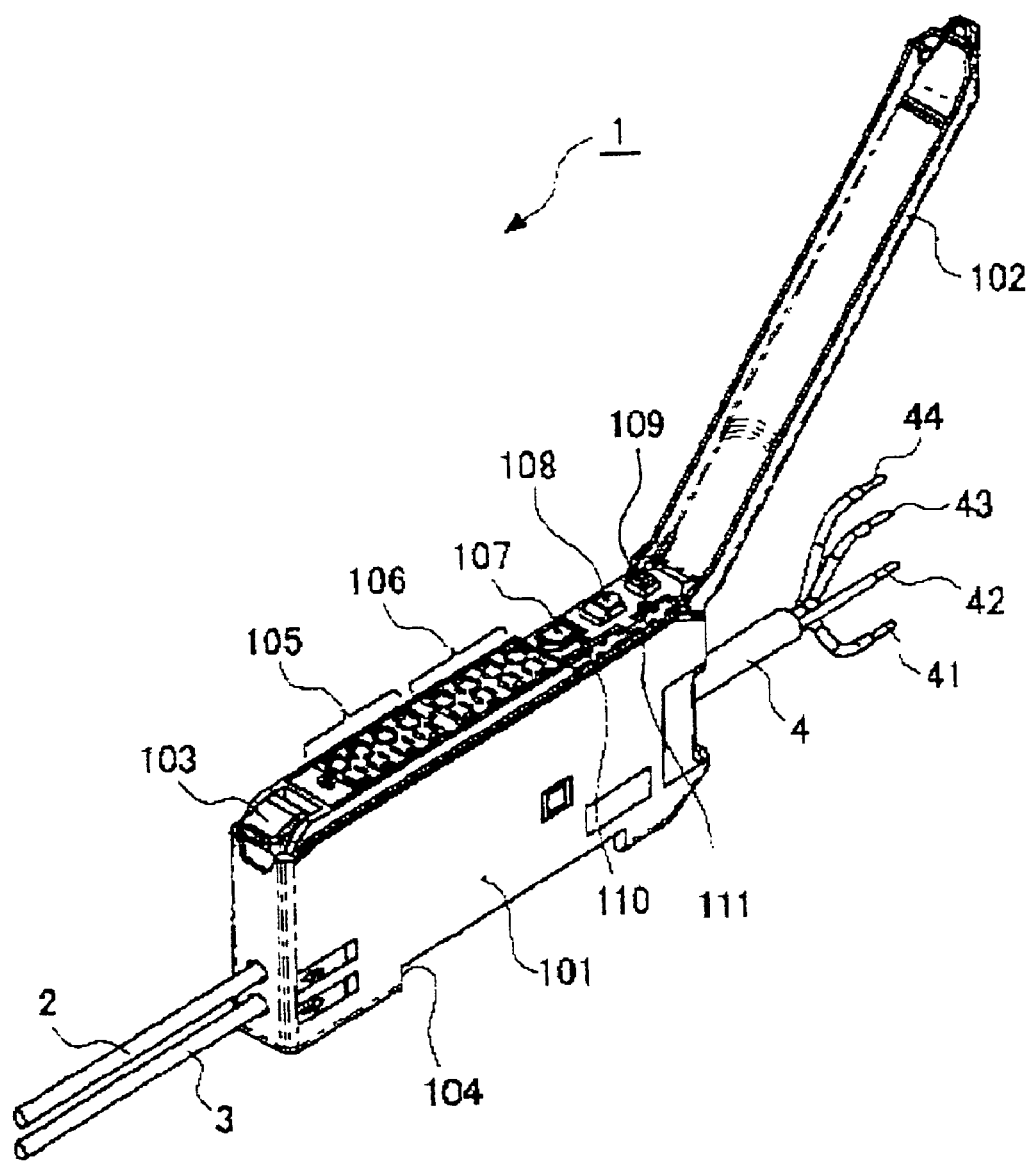
FIG. 1 is a perspective view of an appearance of a photoelectric sensor of the present invention in a state where a top cover thereof is opened.

FIG. 1 is a perspective view of an appearance of a photoelectric sensor according to an embodiment of the present invention in a state where a top cover thereof is opened. A photoelectric sensor 1 includes a plastic case 101 as shown in the figure. A light projecting fiber 2 and a light receiving fiber 3 are inserted in the front portion of the case 101 and fixed for slipping-off prevention by manipulating a clamp lever 103. An electric cord 4 is extended out from the rear portion of the case 101. The electric cord 4 shown in the figure contains a core wire 41 for GND, a core wire 42 for Vcc, a core wire 43 for detection output and a core wire 44 for an input signal used in activation of automatic sensitivity adjustment.

The case 101 is fixed to a mounting face such as a control panel with DIN rails not shown interposed therebetween. Plural photoelectric sensors 1 can be lined up on and along the DIN rails closely side by side. A symbol 104 indicates a DIN rail engaging groove. A transparent top cover 102 is mounted on the top of the case 101 so as to be enabled to open and close. Provided on the top surface of the case 101 exposed in a state where the top cover is opened are a first display 105, a second display 106, a first operation button (UP) 107, a second operation button (DOWN) 108, a third operation button (MODE) 109, a first slide operation member (SET/RUN) 110 and a second slide operation member (L/D) 111.

Figure 2:
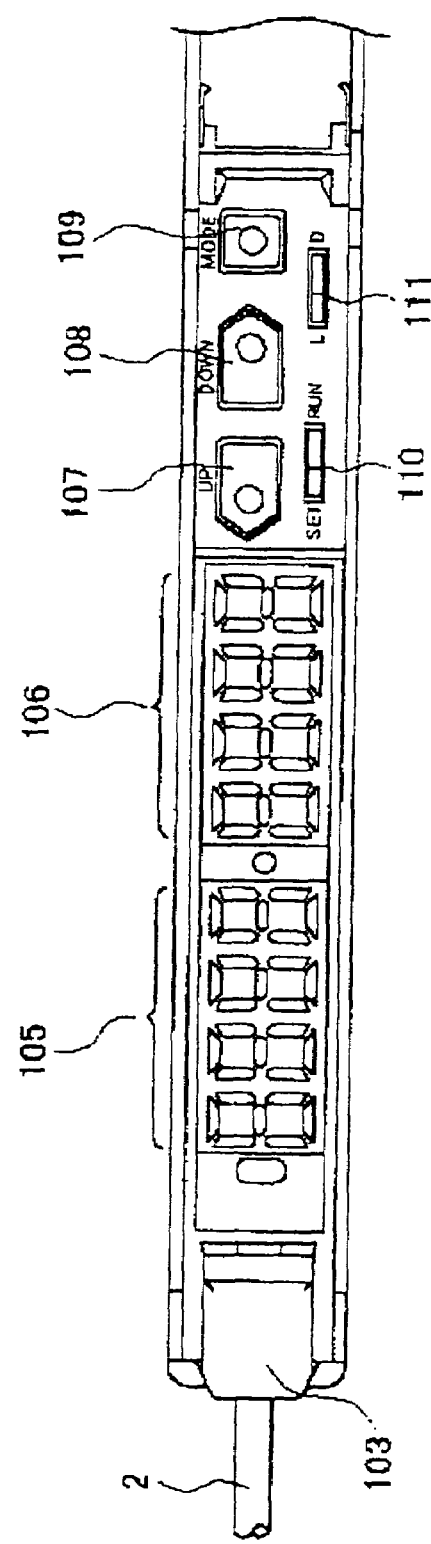
FIG. 2 is an enlarged view of an operation/display unit of a photoelectric sensor of an embodiment of the present invention.

FIG. 2 is an enlarged view of an operation/display unit of a photoelectric sensor of the present invention. As is clear with reference to FIGS. 1 and 2, the first display 105 and the second display 106 are each a 4-digit, 7-segment digital display and each can present a 4 digit number, alphabets and a combination of them in an arbitrary manner. The first operation button 107, the second operation button 108 and the third operation button 109 are each a momentary type push button switch and, as shown in FIG. 2, the first operation button 107 functions as "UP key", the second operation button 108 as "DOWN key" and the third operating key as "MODE key". The first slide operation member 110 and the second slide operation member 111 are each a slide switch and, as shown in FIG. 2, the first slide operation member 110 functions as "SET/RUN change-over switch" and the second slide operation member 111 as "LID change-over switch".

Again in FIG. 1, a light emission element for projecting light and a light reception element for receiving light are built in the interior of the case 101 though not shown in FIG. 1. By inserting the fiber 2 for projecting light into a fiber insert hole with certainty, an end face of the fiber 2 for projecting light and the light emission unit of the light emission element for projecting light are optically coupled with certainty to thereby project light generated from the light emission element for projecting light to a detection region from a fiber head not shown at the distal end of the optical fiber 2 for projecting light being transmitted through the optical fiber 2 for projecting light. Similarly, by inserting the fiber 3 for receiving light into a fiber insert hole with certainty, an end face of the fiber 3 for receiving light and a light reception element for receiving light are optically coupled to thereby cause light introduced into the interior of the fiber 3 for receiving light, not shown, from a fiber head of the fiber 3 for receiving light to reach the light reception element for receiving light through the fiber 3 for receiving light. The configuration of a light emission element for projecting light and a light reception element for receiving light, described above, is similar to that adopted in a conventional fiber type photoelectric switch of this kind.

Figure 3:
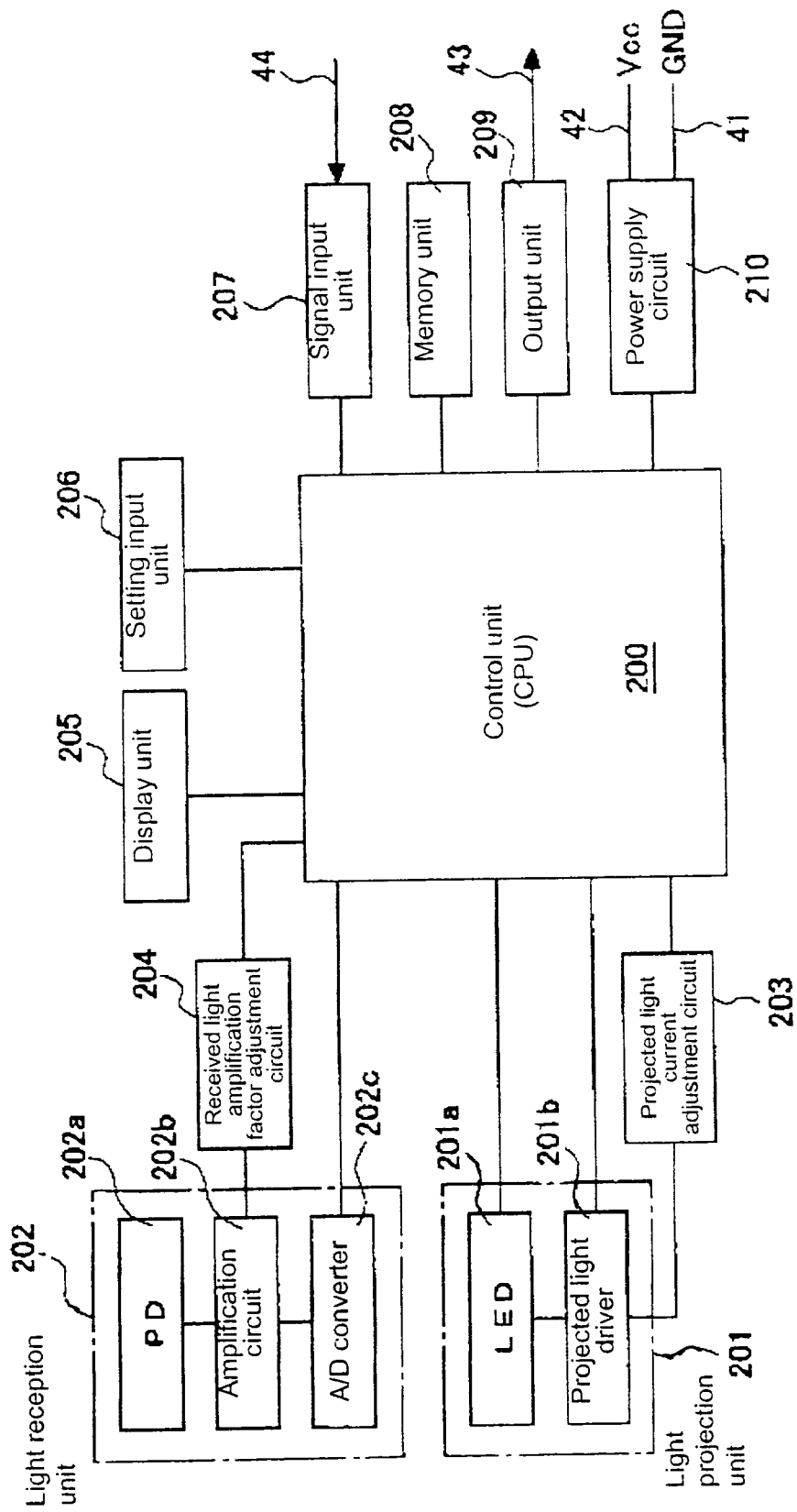
FIG. 3 is a block diagram showing an entire electric hardware configuration of a fiber type photoelectric sensor that is an embodiment of the present invention.

FIG. 3 is a block diagram showing an entire electric hardware configuration of a fiber type photoelectric sensor of FIG. 1. The circuitry is constituted of a CPU 200 as a center constructed from a microprocessor as a main constituent and others. Built in the CPU 2000 are the microprocessor described above, in addition thereto, a ROM storing a system program, a working RAM necessary for execution of the program and others. Since a configuration of the CPU 200 is publicly known in various ways in kinds of literatures, detailed description of the configuration will not be given.

In the figure, shown in the leftmost side is the light projection unit 201 having the light emission element and the light reception unit 202 having a light reception element, which are described above. The light projection unit 201 includes: a light emitting diode (hereinafter, referred to as LED) 201a, which is a light emission element for projecting light; and a projected light driver 201b for driving the LED 201a. A power of light generated from LED 201a is automatically controllable according to a command from the CPU 200. To be concrete, the projected light driver 201b receives a timing signal outputted from the CPU 200 and is pulse driven at a predetermined cycle (for example, 100 μsec). Simultaneously, a value of a projected light current in the projected light driver 201b is adjusted in a predetermined range by a projected light current adjustment circuit 203. The projected light current adjustment circuit 203 operates according to a command from the CPU 200. Therefore, the LED 201a emits light pulsewise at timings according a command from the CPU 200 and a light emission luminance at that time alters according to a value of a projected light current adjusted in the projected light current adjustment circuit 203. Thereby, a power of light generated from the LED 201a is automatically adjusted.

Note that an automatic adjustment way of a power of projected light is not limited to this, but as another way in addition thereto, a light emission period and/or a light emission cycle of the LED 201a may be altered. Such a control of a light emission period and a light emission cycle can be implemented with ease by properly designing a projected light control program run in the CPU 200.

The light reception unit 202 includes: a photodiode (hereinafter, referred to as PD) 202a which is a light reception element for receiving light; an amplification circuit 202b for amplifying an output of the PD 202a; and an A/D converter 202c for A/D converting an output of the amplification circuit 202b to cause the CPU 200 to capture the converted value. In such a way, an amount of received light by the PD 202a is amplified in the amplification circuit 202b and, thereafter, the amplified value is converted to a digital value in the A/D converter 202c and the digital value is captured into the CPU 200. An amplification factor of the amplification circuit 202b is adjusted in a predetermined range by the action of the received light amplification factor adjustment circuit 204 operated under control of the COU 200. In other words, an amount of received light by the PD 202a is converted in the amplification circuit 202b at a predetermined conversion factor and, thereafter, the converted value is captured into the CPU 200. Simultaneously, the conversion factor at that time can be adjusted in a predetermined range by the action of the received light amplification factor adjustment circuit 204.

A display unit 205 is constructed of displays for display data generated by kinds of operations in the CPU 200 and, to be concrete, includes the first display 105 and the second display 106 described above with reference to FIGS. 1 and 2. The first and second displays 105 and 106 present displays including various kinds of information pieces associated with the automatic sensitivity adjusting function of the present invention using numerical values, alphabets and a combination thereof, which is detailed later.

A setting input unit 206 is used for inputting kinds of data to the CPU 200 through a manual operation conducted by an operator and the setting input unit 206 includes the first operation button 107, the second operation button 108, the third operation button 109, the first slide operation member 110 and the second slide operation member 111.

A signal input unit 207 is used for inputting an automatic sensitivity adjustment activating signal through the core wire 44 of the electric cord 4 described with reference to FIG. 1 and the automatic sensitivity adjustment activating signal from the core wire 44 is captured into the CPU 200 through the signal input unit 207.

An output unit 209 is used for outputting a detection signal for object detection generated in the CPU 200 to the core wire 43 contained in the electric cord 4. Thereby, the detection signal for object detection generated in the CPU 200 is sent onto the core wire 43 of the electric cord 4 through the output unit 209. The core wires 43 and 44 contained in the electric cord 4 are generally connected to host apparatuses such as a PLC (Programmable Logic Controller), a control computer and the like.

A memory unit 208 is constituted of non-volatile memory elements such as EEPROM. Stored in the memory unit 208 are kinds of data set on the side of a maker before shipment and kinds of data set on the side of a user after the shipment. Data associated with the present invention to be stored are target value data for a detection value used in automatic sensitivity adjustment.

A power supply circuit 210 is used for supplying a stabilized DC power supply to the light projection unit 201, the light reception unit 202, the projected light current adjustment circuit 203, the received light amplification factor adjustment circuit 204, the display unit 205, the setting input unit 206, the signal input unit 207, the memory unit 208 and the output unit 206, all described above, and is constituted of a power supply stabilization circuit and others. To be more concrete, the power supply circuit 210 is supplied with a power supply Vcc through the core wire 42 contained in the electric cord 4 and supplied with GND through the core wire 41 contained therein.

Then, description will be given of various kinds of functions provided in a photoelectric sensor and a structure of a system program run in the CPU 200 for realizing the various functions in the mechanical structure and the electric hardware configuration described above as the precondition for the description.

The photoelectric sensor has plural functions capable of being selectively performed (ON/OFF). Each of the functions has various selecting choices. Selection of the functions (ON/OFF) and determination on the selecting choices can be realized by setting the photoelectric sensor in SET mode. An operation realizing a function to which ON setting is performed according to a specific selecting choice can be realized by setting the photoelectric sensor in RUN mode. Designation on whether an operating mode is set to SET mode or RUN mode can be, as shown in FIG. 2, performed by manipulating the first slide operation member 110 so as to be shifted to "SET" side or "RUN" side. Incidentally, the second slide operation member 111 is used for setting a logic polarity of a detection output signal of the photoelectric sensor and the photoelectric sensor assumes a so-called light on mode if the second operation member 111 is set to "L" side, while assuming a dark on mode if being set to "D" side.

Figure 4:
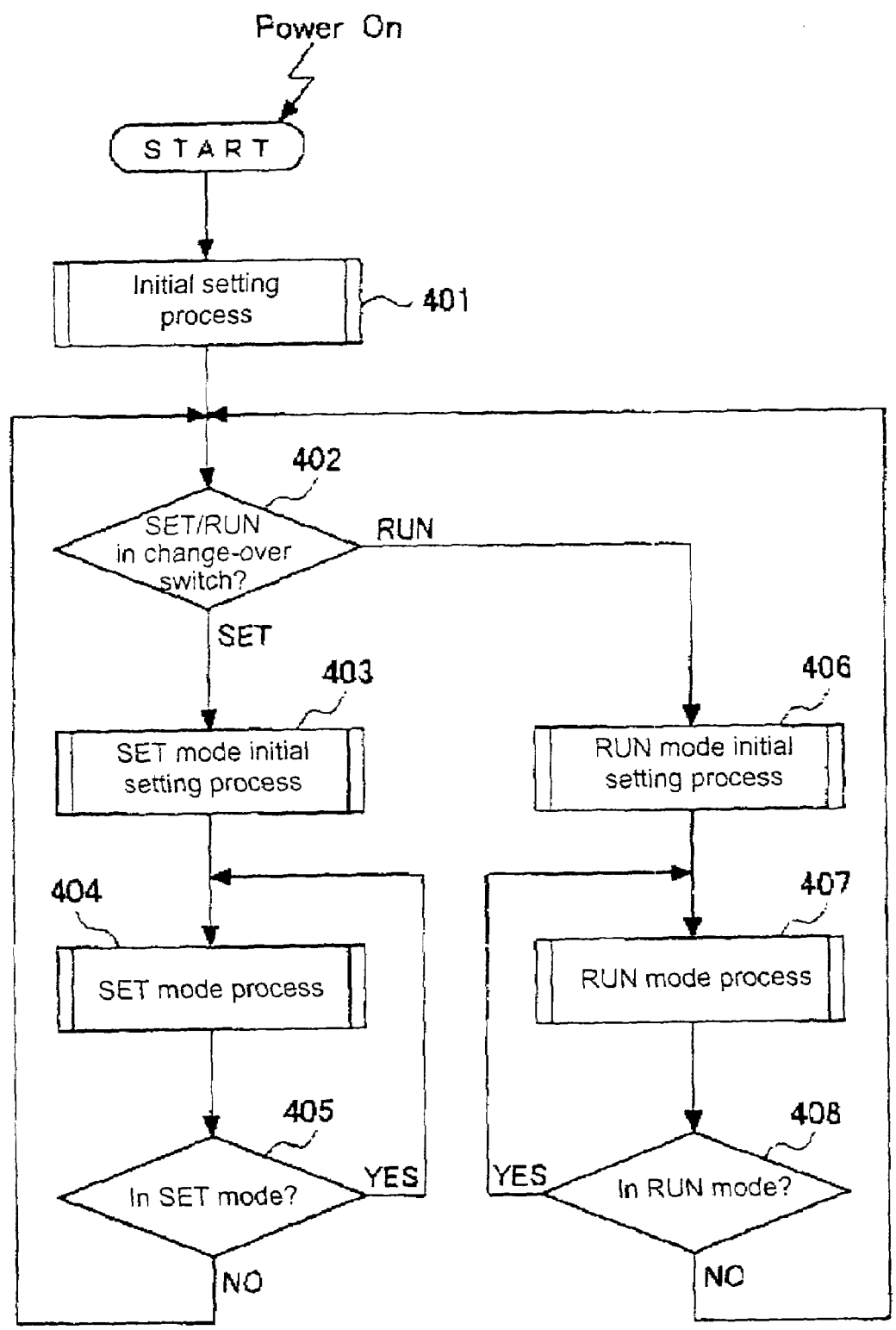
FIG. 4 is a general flowchart schematically showing an entire system program executed in a CPU.

FIG. 4 is a general flowchart schematically showing an entire system program executed in the CPU. The system program is started by power-on.

In the figure, when the process is started, an initial setting process (step 401) is at first performed. In the initial setting process (step 401), various kinds of necessary initial setting process are performed prior to the start of a routine process described later. In the initial setting process, various processes are performed, which are execution of initialization of various kinds of memories, display lamps and a control output; and reading necessary items from EEPROM included in the memory unit 208 and data check and others.

When execution of the initial setting process (step 401) is completed, the process advances to the routine process and, at first, a setting state of the first slide operation member 110 is referred to (step 402). Herein, if the first slide operation member 110 is set on the "SET" side (SET in step 402), successively, a SET mode initial setting process (step 403) is performed. In the SET mode initial setting process (step 403), initialization is performed of a SET mode setting value and initialization of a function number (F=0) and others.

Figure 12:
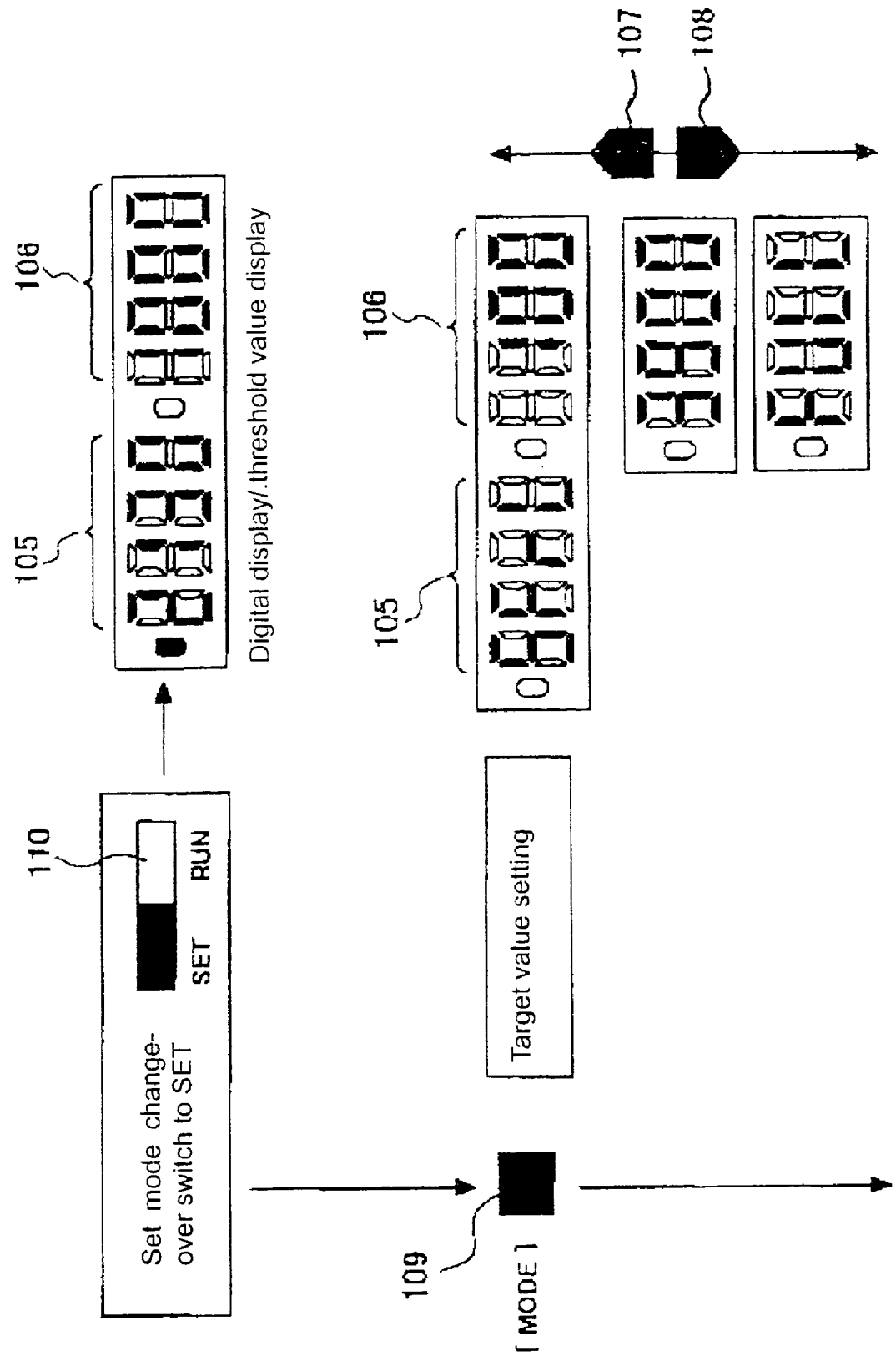
FIG. 12 is a representation for describing an operating procedure for altering a target value.

When execution of the SET mode initial setting process (step 403) is completed, thereafter, SET mode processes related to various kinds of functions (step 404) are performed as far as the first slide operation member 110 is in a state to be set to the "SET" side (YES in step 405). In this state, a user properly manipulates the first operation button 107, the second operation button 108 and the third operation button 109, thereby enabling ON/OFF setting of various kinds of functions (F) prepared for the photoelectric sensor and, in addition, execution of individual setting process for different functions (F). Included among the functions (F) is an automatic sensitivity adjusting function associated with the present invention. Therefore, a setting process for an automatic sensitivity adjusting function that will be described later with reference to a flowchart of FIG. 7 and a descriptive representation of FIG. 12 is performed in the SET mode process (step 404).

On the other hand, a setting state of the first slide operation member 110 is referred to and, as a result, when it is determined that the slide operation member 110 is set to the "RUN" side (RUN in step 402), a RUN mode initial setting process (step 406) is successively performed. In the RUN mode initial setting process (step 406), the following processings are performed: initialization of a display lamp and a control output, initialization of a threshold value and various kinds of RUN mode setting values and the like. Note that an automatic sensitivity adjusting function that will be described later with reference to flowcharts of FIGS. 8 to 10 and descriptive representations of FIG. 11 and display examples of FIG. 13 are performed in the RUN mode processing (step 407).

In such a way, the system program executed in the CPU 200 is in a broad sense classified into a so-called initial setting process (step 401) which is an initial process performed immediately after power on and two process, which are routine processes, that is a SET mode process (step 404) and a RUN mode process (step 407) combined.

Figure 5:
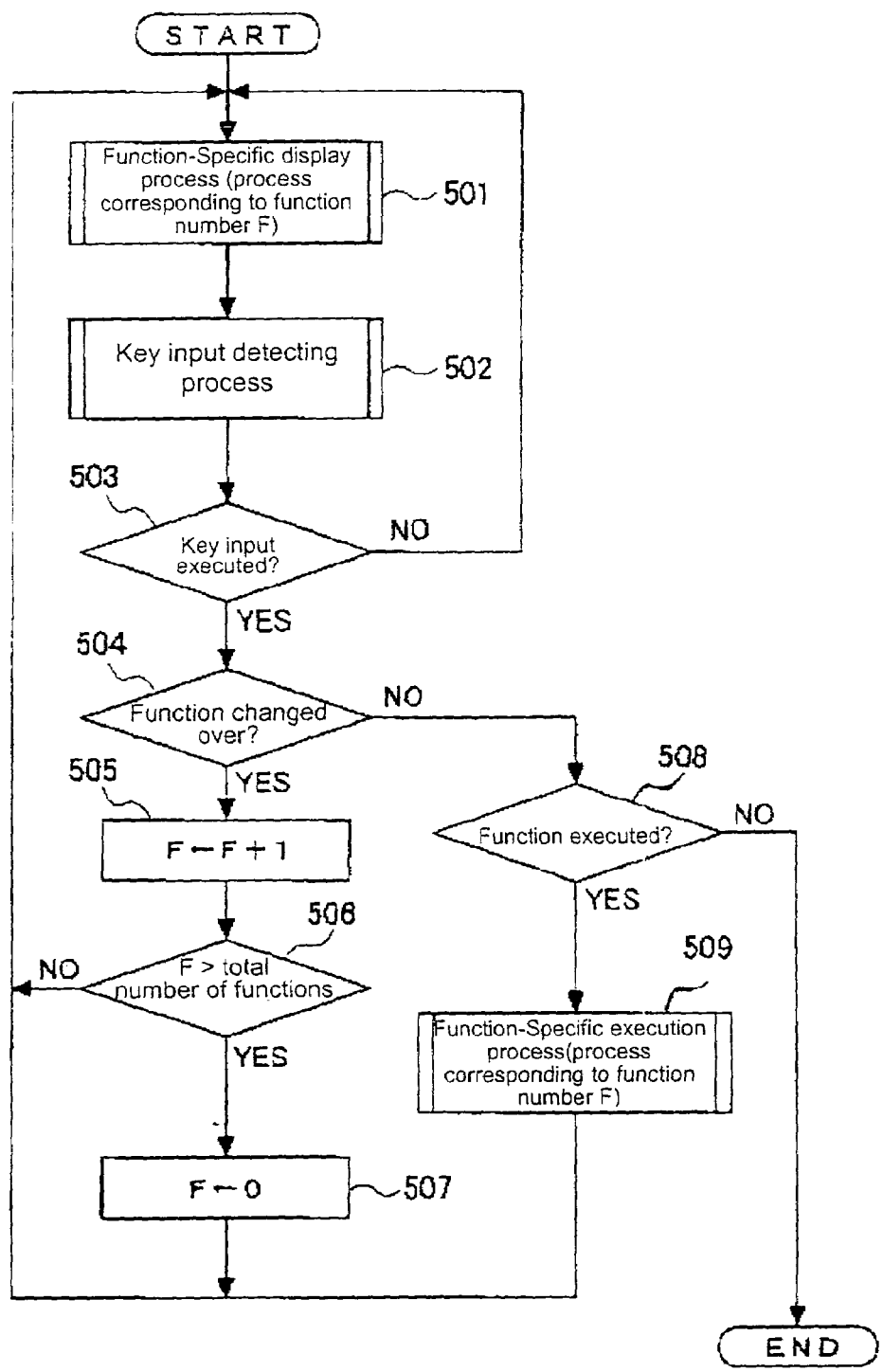
FIG. 5 is a flowchart showing an entire SET mode process.

FIG. 5 is a flowchart showing an entire SET mode process. In the figure, when the process is started, a function-specific display process (step 501) is at first performed. Performed in the function-specific display process (step 501) are various display processes corresponding to function numbers (F).

In succession, a key input detecting process performed (step 502) and the process enters a state to wait for the presence or absence of key input manipulations on the operation buttons 107 to 109 and the slide operation members 110 and 100 shown in FIGS. 1 and 2 (NO in step 503).

In this state, when it is determined that a key input is present (YES in step 503) and, further, when a confirmation is obtained on a key input sequence corresponding to change-over between functions (YES in step 504), a value of the function number (F) is incremented by one each time when a function change-over command is confirmed till the value of the function number (F) reaches a total number of functions (step 505, NO in step 506) and when the value of the function number (F) reaches the total number of functions, the function number (F) is zero reset (step 507) to perform circulating change-over of the function (F).

When an instruction is issued for execution related to a function (F) set at that time in this state (NO in step 504, YES in step 508), a function-specific execution process is performed and a process corresponding to the function (F) is performed (step 509).

In an automatic sensitivity adjusting mode related to the present invention, possible in the function-specific execution process (step 509) is the setting of whether a default value set on shipment from a factory as a target value for a detection value is used or, alternatively, an arbitrary target value desired by a user is used.

Figure 7:
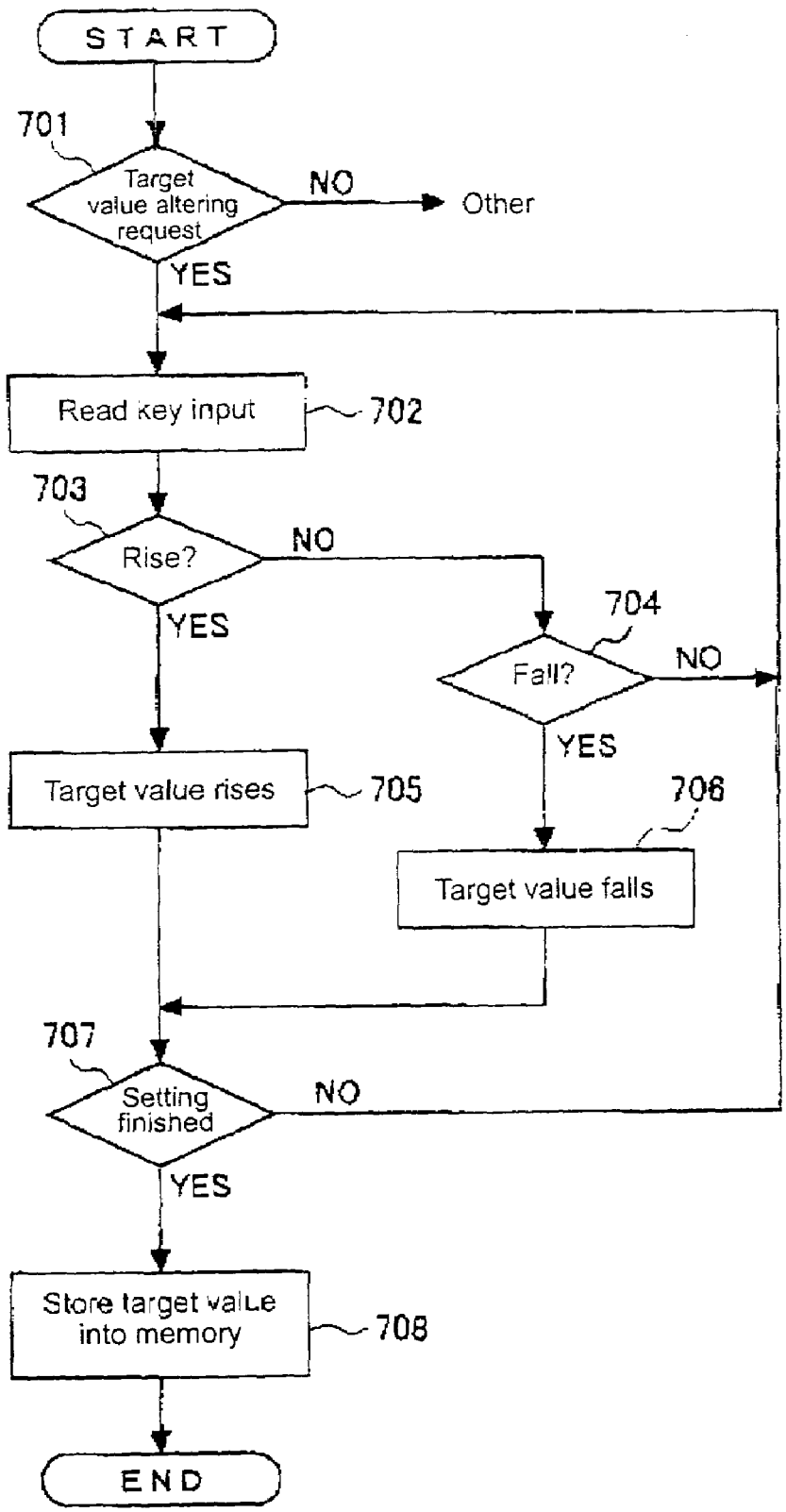
FIG. 7 is a flowchart showing a main part of a function-specific execution process in detail.

FIG. 7 is a flowchart showing a main part of a function-specific execution process related to an automatic sensitivity adjusting function in detail. The flowchart shown in FIG. 7 is performed by determination that as a result of detection of a predetermined key manipulation in the key input detecting process (step 502), the function (F) is an automatic sensitivity adjusting function in a function execution determining process (step 508). In FIG. 12, there is shown a representation for describing an operating procedure altering a target value together therewith.

Description will be given of the process with reference to the flowchart of FIG. 7 and the descriptive representation of FIG. 12. When the slide switch 110, which is the mode change-over switch, is set to the "SET" side, an amount of received light at the time (herein, "2130") is displayed on the first display 105 and a threshold value at the time (herein, "1000") is displayed on the second display 106.

In this state, when a key manipulation corresponding a target value altering request (YES in step 701), a display (herein, "SFrL") indicating a target value setting is displayed on the first display 105 and a target value at the time (herein, "100") is displayed on the second display 106 as shown in FIG. 12.

In this state, when the first operation button 107 and the second operation button 108 are properly manipulated, in the flowchart of FIG. 7, a key manipulation is detected in a key input process (step 702) and, thereafter, a determination process is executed on whether contents of the manipulation shows "rise" or "fall" (steps 703, 704). Herein, when it is determined that the contents of the operation instructs "rise," (YES in step 703) a target value at the time is altered in the rise direction (step 705), while when it is determined to be "fall" to the contrary (YES in step 704) a target value at the time is altered in the fall direction (step 706). In this example, a value of a target value can be, as shown in FIG. 12, altered only in the range of from a predetermined lower limit value (herein, "100") to a predetermined upper limit value (herein, "3900"). Note that though not shown in the flowchart of FIG. 7, the sensor is designed so that when a user selects "FULL" in a predetermined manipulation, a sensitivity of the sensor is increased to the maximum sensitivity regardless of a received light level at the time of execution.

When setting of a desired target value is completed, setting completion is determined as shown in the flowchart of FIG. 7 by performing a predetermined completion operation (YES in step 707) and the target value data thus obtained is stored into EEPROM included in the memory unit 208 to use the data in an automatic sensitivity adjusting function at a time to come.

In the flowchart of FIG. 5, when it is determined that no function change-over command is issued (NO in step 504) and that no function is executed (NO step 508), the process is terminated and the above operations are repeatedly performed (steps 501 to 508).

Figure 6:
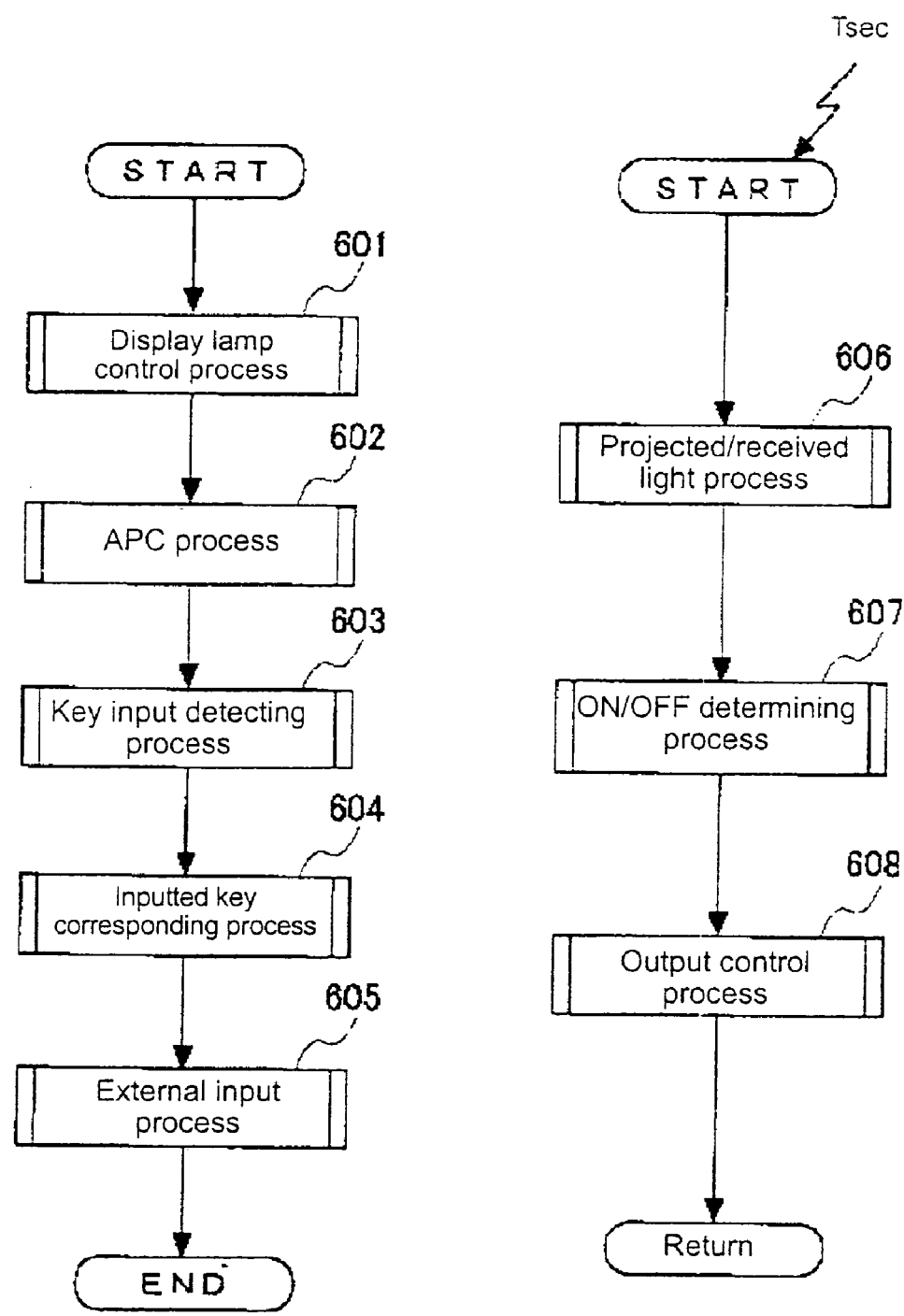
FIG. 6 is a flowchart showing an entire RUN mode process.

Then, description will be given of the RUN mode process (step 407) shown in the flowchart of FIG. 4. FIG. 6 is the flowchart showing the entire RUN mode process. The entire RUN mode process is, as shown in the figure, in a broad sense classified into an ordinary process (steps 601 to 605) and an interruption process (steps 606 to 608). The interruption process (steps 606 to 608) is performed in timer interruption at time intervals of a time T sec (for example, every 100 μsec).

First of all, description will be given of the ordinary process (steps 601 to 605). When the process is started, a display lamp control process (step 601) is performed. In the display lamp control process (step 601), lighting control of the first and second displays 105 and 106, which are 7-segment digital display, is performed according to designated display contents.

Successively, an auto power control (hereinafter, referred to as APC) process (step 602) is performed. In the APC process (step 602), an amount of received light for a monitor obtained in a measurement use projected/received light process (step 606) described later is monitored using a monitor light reception element disposed so as to directly receive light not impinging on a fiber after being emitted from a light emission element and an APC correction is performed at intervals of a predetermined period. The APC correction is, in this example, realized by a power control of a projected light current for compensating a change in luminous efficiency over time of a light emission element.

In succession, a key input detecting process (step 603) is performed. In the key input detecting process (step 603), detection of key input is performed at intervals of a predetermined period and when input is detected, setting is performed so as to enable a corresponding process to be performed. Successively, a key input corresponding process (step 604) is performed and various kinds of processes corresponding to detected key inputs are performed.

Figure 8:
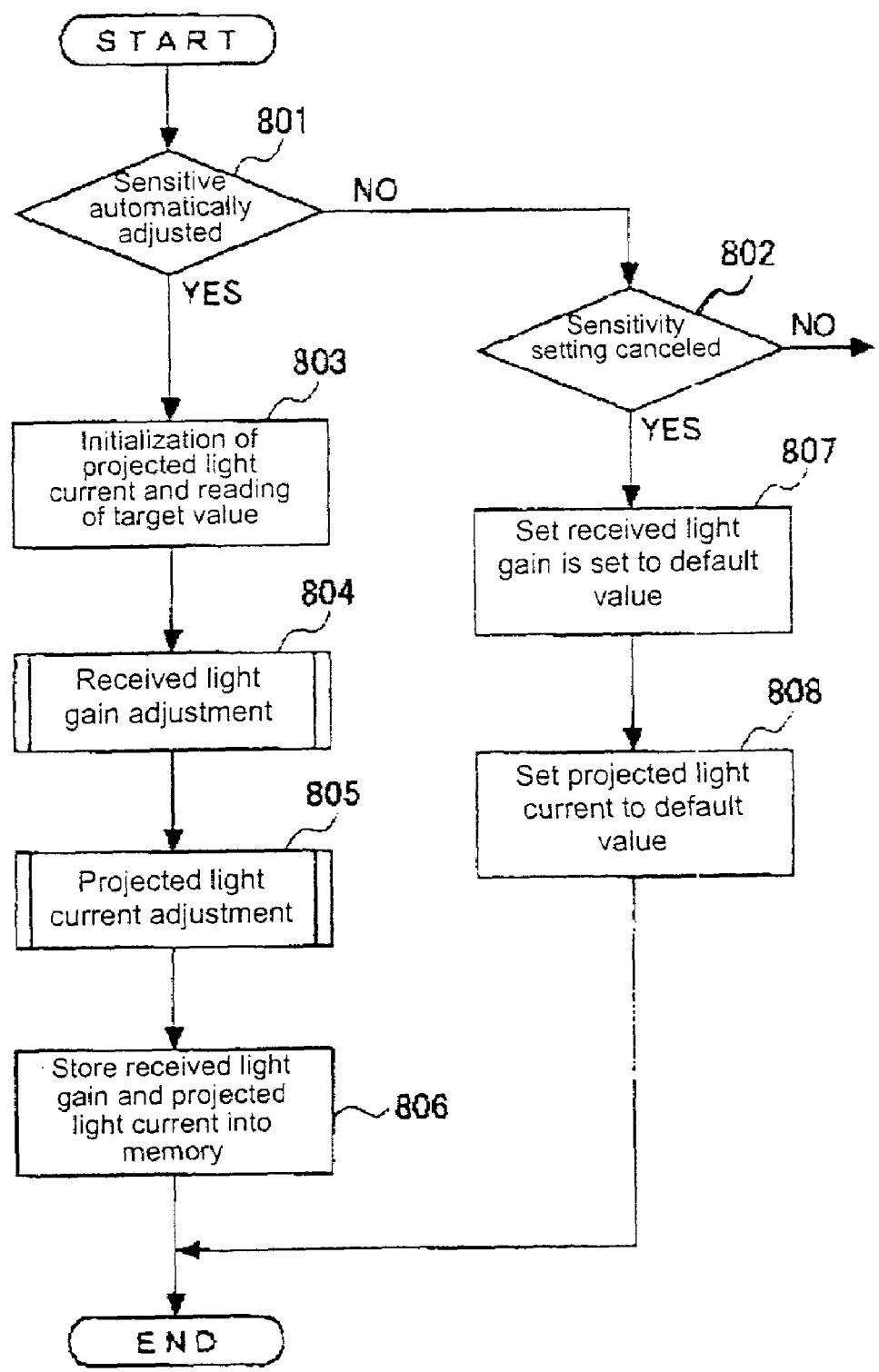
FIG. 8 is a flowchart showing a main part of an inputted key corresponding process in detail.
Figure 9:
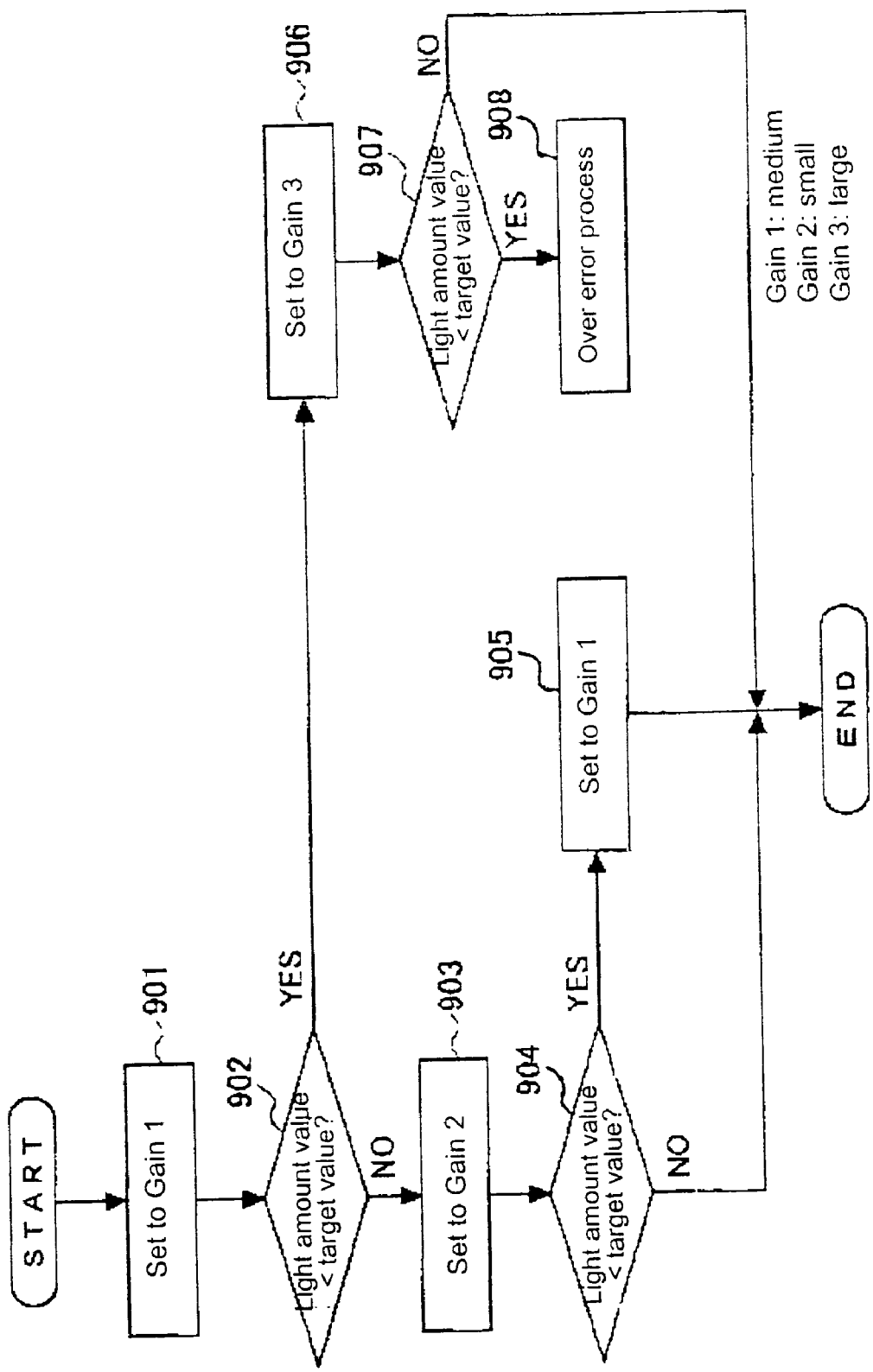
FIG. 9 is a flowchart showing a received light gain adjusting process in detail.
Figure 10:
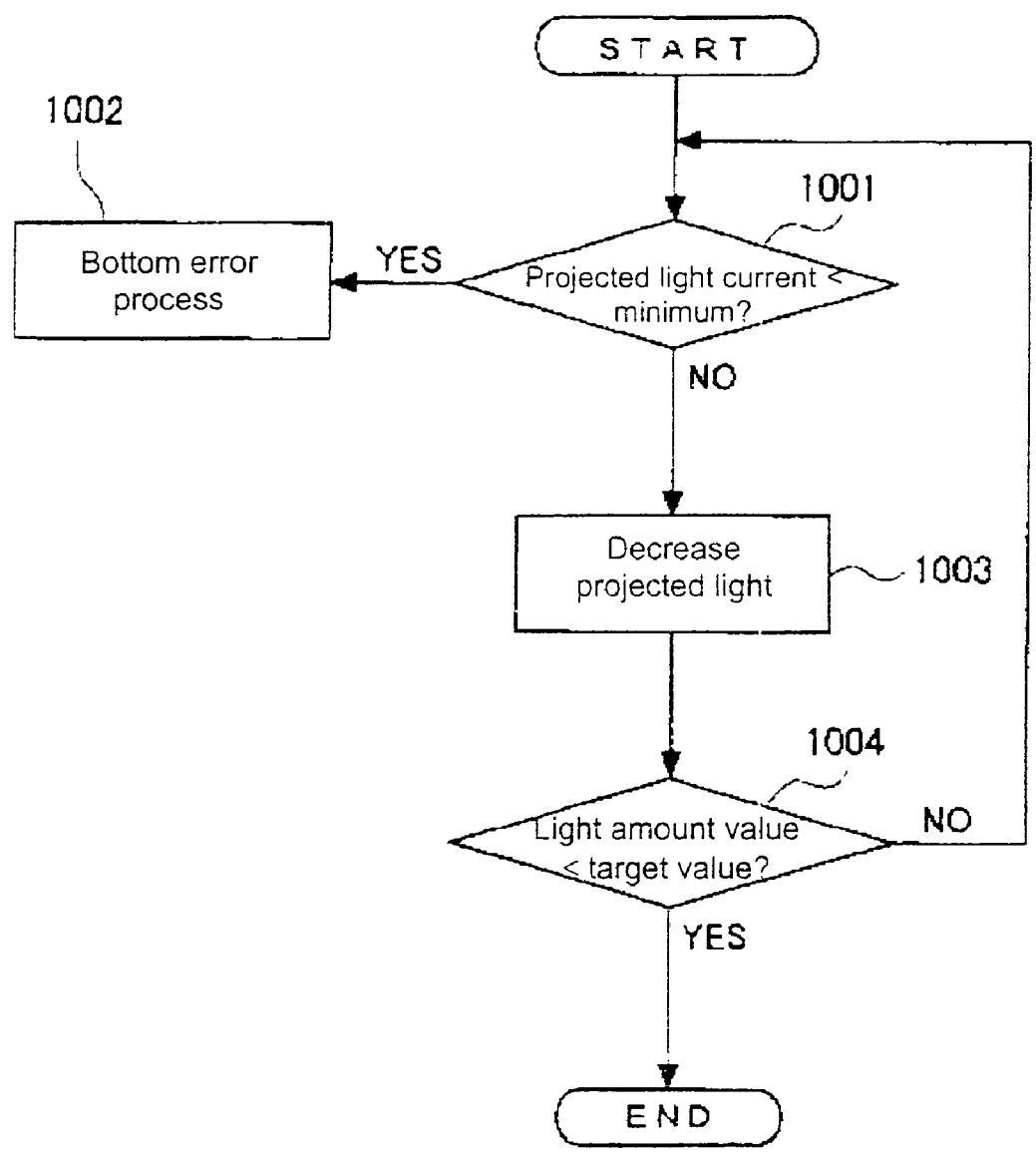
FIG. 10 is a flowchart showing a projected light current adjusting process in detail.

In connection with an automatic sensitivity adjusting function, which is a main part of the present invention, an automatic sensitivity adjusting process and a sensitivity setting canceling process are performed in the inputted key corresponding process (step 604) as shown in the flowcharts of FIGS. 8 to 10 and descriptive representations of FIGS. 11 and 13.

FIG. 8 is a flowchart showing a main part associated with the present invention of the inputted key corresponding process (step 604) shown in FIG. 6 in detail. In the flowchart, there are mainly shown an automatic sensitivity adjusting process and a sensitivity setting canceling process.

When the process is started in the figure, the process enters a state of waiting for a start instruction of an automatic sensitivity adjusting process or of a sensitivity setting canceling process (steps 801, 802). In this example, herein, as shown in FIG. 11A, by depressing the third operation button 109 for 3 sec while the slide operation member 110 is set to the "RUN" side, it is enabled to instruct the start of execution of the automatic sensitivity adjusting function.

In the flowchart of FIG. 8, when the start instruction for the automatic sensitivity adjustment is confirmed (YES in step 801), successively, initialization of a projected light current and reading of a target value is performed (step 803). In this example, values of a projected light current can be set at one of N levels (for example, 12000 level) with an equal increment and the maximum value is set in step 803. A target value can be, as described above, read from EEPROM in the memory unit 208 shown in FIG. 3. With such a construction adopted, when the initialization of a projected light and reading of a target value are completed, a received light gain adjusting process (step 804) is successively performed.

FIG. 9 is a flowchart showing a received light gain adjusting process in detail. In this example, a received light gain means an amplification factor of the amplification circuit 202b and the amplification factor can be, as described above, adjusted by the action of the received light amplification factor adjustment circuit 204. Especially in this example, a value of the received light gain can be set changing over among three levels of Gain 1 (medium), Gain 2 (small) and Gain 3 (large).

In the situation described above, when the flowchart shown in FIG. 9 is started, the received light gain is at first set to Gain 1 (medium) (step 901) and thereafter, in the state, comparison is performed, as to which is larger, between a "light amount value" read from the A/D converter 202c and a "target value" read in advance from the EEPROM (step 902). When it is determined that the "light amount value" is smaller than the "target value" (YES in step 902), a received light gain is successively set to Gain 3 (large) (step 906). Thereafter, in that state, comparison is performed, as to which is larger, between a "light amount value" read through the A/D converter 202c and the "target value" (step 907). When it is determined that the "light amount value" is larger than the "target value" (NO in step 907), the received light gain adjusting process is terminated and the process advances to a projected light current adjusting process shown in FIG. 10. On the other hand, when it is determined that the "light amount value" is still smaller than the "target value", though a gain has been increased from Gain 1 to Gain 3 (YES in step 907), an over error process (step 908) is performed and an over error display is presented as shown in FIG. 13B using the first display 105 and the second display 106. In this example, "FrEE" is displayed on the first display 105 and "ovEr" is displayed on the second display 106. With such displays presented, a user can recognize that the set "target value" is excessively higher than the current "light amount value". In this case, no sensitivity adjustment is performed.

On the other hand, when it is determined that a "light amount value" is larger than a "target value" in step 902 (NO in step 902), a value of a received light gain is set to Gain 2 (small) and, thereafter, comparison is performed, as to which is larger, between a "light amount value" newly read and the "target value" (step 904). When it is determined that the "light amount value" is larger than the "target value" (NO in step 904), the received light gain adjusting process is normally terminated and the process advances to the projected light current adjusting process shown in FIG. 10. When it is determined in step 904 that the "light amount value" is smaller than the "target value" (YES in step 904), the value of a received light amount is set back to Gain 1 (medium) which is the original value (step 905) and, thereafter, the received light gain adjusting process is normally terminated and the process advances to the projected light current adjusting process shown in FIG. 10.

In FIG. 8, when the received light gain adjusting process (step 804) is finished, the projected light current adjusting process (step 805) is successively performed. In the flowchart of FIG. 10, there are shown details of the projected light current adjusting process (step 805).

In the figure, when the process is started, comparison is performed, as to which is larger, between a value of the projected light current and the predetermined "minimum value". Herein, when it is determined that the value of the projected light current is smaller than the predetermined "minimum value" (YES in step 1001), a bottom error process (step 102) is performed and a bottom error display is presented, as shown in FIG. 13C, using the first display 105 and the second display 106. In this example, "FrEE" is displayed on the first display 105 and "botm" is displayed on the second display 106. With such displays presented, a user can recognize that the set "target value" is excessively lower than the current "light amount value". In the bottom error process, the projected light current is set to the predetermined "minimum value". This is because there is a case where, in this state, a detection operation can be performed.

Again, in the flowchart of FIG. 10, when it is determined that a value of the projected light current is larger than the predetermined "minimum value" (NO in step 1001), the projected light driver 201b is controlled through the projected light current adjustment circuit 203, thereby an operation decreasing the projected light current is performed (step 1003). In this state, comparison is again performed, as to which is larger, between a "light amount value" and the "target value" (step 1004). Thereafter, a value of the projected light current is stepwise decreased over N levels (step 1003) till the "light amount value" is lower than the "target value" (NO in step 1004) and the projected light current adjusting process is terminated after the "light amount value" coincides with or lower than the "target value" (YES in step 1004).

In such a way, in the received light gain adjusting process shown in FIG. 9, a value of the received light gain is set to Gain 1, which is at a medium level, (step 901) and, in this state, comparison is performed, as to which is larger, between a "light amount value" and the "target value" (step 902). The received light gain is increased to Gain 3 (large) (step 906) or decreased to Gain 2 (small) (step 903) according to a result of the comparison and furthermore, in this state, it is determined which is larger, a "light amount value" or the "target value" (steps 904, 907); and a value of the received light gain is adjusted according to a result of the determination (step 905) to thereby finally determine a value of the received light gain. At that time, when the "light amount value" is lower than the "target value" (YES in step 907) even when a value of the received light gain is maximized (step 906), it is determined that the "target value" set in comparison with a "light amount value" actually detected is excessively higher and the over error process (step 908) is performed.

In the projected light current adjusting process shown in FIG. 10, a value of the projected light current is decreased gradually stepwise over N levels (step 1003) from a state where the projected light current is set at the maximum value, and after a detected "light amount value" becomes lower than the set "target value" (YES in step 1004), setting of the projected light current is completed. Therefore, the adjustment process for the procedures shown in FIGS. 9 and 10 can complete sensitivity adjustment in an extremely short time.

Note that a LED has a possibility that a light amount is decreased if a large projected light current flows therethrough, wherein a larger projected light current degrades the LED earlier. By adjusting the projected light current so as to decrease from an initial value without fail, degradation of the LED can be avoided to the lowest possible level.

By selecting a projected light current most closest to the reference value in a scheme where the projected light current is decreases one level at a time, a signal level can be adjusted with a good precision relative to the reference value.

While by adjusting a projected light current and a received light gain amplification factor, there is a case where a change occurs in noise level relative to a signal level, a variation in detection precision decreases by adjusting a hysteresis width according to a table (a calculation formula) determined in advance.

Again, in the flowchart of FIG. 8, when the projected light current adjusting process (step 805) is completed, the termination process (step 806) is successively performed and a received light gain and data showing a value of the projected light current, thus obtained, are stored into EEPROM built in the memory unit 208 (step 806). At that time, a display is presented that shows the sensitivity adjustment has been normally completed, as shown in FIG. 13A, using the first display 105 and the second display 106. In this example, the "target value" for sensitivity adjustment is set to "2000", and a threshold value is set to "1000". In this case, the current light amount value is displayed on the first display 105 as "2000" and the threshold value is displayed on the second display 106 as "1000".

On the other hand, in FIG. 8, when an instruction for canceling the sensitivity adjustment has been confirmed (YES in step 802), a value of received light gain stored in EEPROM is set to a default value set prior to shipment from a factory (step 807) and a value of the projected light current is set to a similar default value (step 808). Even after a sensitivity is automatically adjusted, a received light gain and a projected light current value stored in the EEPROM can be restored to respective default values set on the side of a maker prior to shipment from a factory by performing a key manipulation corresponding to a sensitivity setting canceling instruction in the setting input unit 206 (YES in step 802). Note that in this example, it is designed so that by simultaneously depressing the second operation button 108 and the third operation button 109 for 3 sec without interruption, a sensitivity setting canceling instruction can be issued as shown in FIG. 11B.

Again, in the flowchart of FIG. 6, when the inputted key corresponding process (step 604) is completed in such a way, an external input process (step 605) is successively performed. In the external input process (step 605), an input signal for automatic sensitivity adjustment activation is read through the signal input unit 207 shown in FIG. 3 and it is determined whether contents of the input signal are ON or OFF. When it is determined that a value of the input signal for automatic sensitivity adjustment activation is in an ON state, activation of the automatic sensitivity adjusting process is confirmed in a similar manner to the case in step 801 in FIG. 8; and an operation similar to steps 803 to 806 is thereafter performed to thereby match a value of the detected "light amount value" with the "target value" set in advance. That is, in the photoelectric sensor of this embodiment, by not only key manipulation in the setting input unit 36, but also providing an input signal for automatic sensitivity adjustment activation from the core wire 44 contained in the electric cord 4, the automatic sensitivity adjusting processing can be performed and, by using such an operation, the automatic sensitivity adjusting process can be remotely activated by a PLC, a control computer or the like.

Then, description will be given of the interruption process performed at intervals of a time of T sec. When the interruption process is started, the projected/received light process (step 606) is at first performed. In the received light process (step 606), by pulse driving the LED 201a shown in FIG. 3 through the projected light driver 201b, visual light or infrared light is generated, the light is guided to a light projection head (not shown) through the light projecting fiber 2 and projected out from the light projection head to a detection target region. Light reflected on or transmitted through the detection target region is guided from a light reception head provided at the distal end of the light receiving fiber 3 into the light receiving fiber 3 and further guided to the PD 202a through the light receiving fiber 3; and a signal obtained by photoelectric conversion in the PD 202a is amplified in the amplification circuit 202b and thereafter, the amplified output is captured into the CPU 200 through the A/D converter. Thereby, obtained by the CPU 200 is a received light amount including a characteristic amount corresponding to a situation of the detection target region.

The ON/OFF determining process (step 607) is successively performed. In the ON/OFF determining process (step 607), by discriminating and binarizing received light amount data with a preset threshold value of a light amount for ON/OFF determination as a reference value, determination is performed on the presence or absence of an object in a detection target region. That is, if a target object exists in the detection target region, a determination result assumes ON, while if absent, a determination result assumes OFF.

The threshold value of a light amount for ON/OFF determination can be set by performing a teaching function prepared as one of the function-specific execution process (step 509) in SET mode. The threshold value of a light amount can be altered by manipulation of the UP operation button 107 and the DOWN operation button 108 as one of the key input detecting process (step 603) in RUN mode. At this time, the received light amount data is displayed on the display unit 105 and the threshold value is displayed on the display unit 106, both in numerical value.

Since by performing the automatic sensitivity adjusting process, a light amount value is matched with a target value, the same threshold value can be set in a manual operation on plural photoelectric sensors without applying a teaching function to each of the multiple photoelectric sensors in a case where a threshold value in the same usage situation is repeatedly set on the multiple photoelectric sensors.

In another embodiment of threshold value setting, plural threshold values which are selectable are prepared and one of the threshold values prepared is selected by key manipulation. At this time, displayed on the display unit 106 is a selected threshold value or, a number or a symbol indicating the selected threshold value. With such a construction, since a detection value after sensitivity adjustment is matched with a target value, some threshold values having predetermined discrepancies from the target value are prepared and one of the threshold values is selected, thereby enabling threshold value adjustment without any trouble. By doing so, an adjustment procedure for a threshold value becomes simpler and standardization of usage methods for a photoelectric sensors can be further promoted.

When the ON/OFF determining process (step 607) is completed in this way, the output control process (step 608) is successively performed, and a detection output signal generated in the CPU 200 is sent to the core wire 43 for an object detection signal output contained in the electric cord 4 through the output unit 209. The detection output signal outputted to the core wire 43 in this way is further sent to an host apparatus such as a PLC, a control computer or the like.

Figure 14:
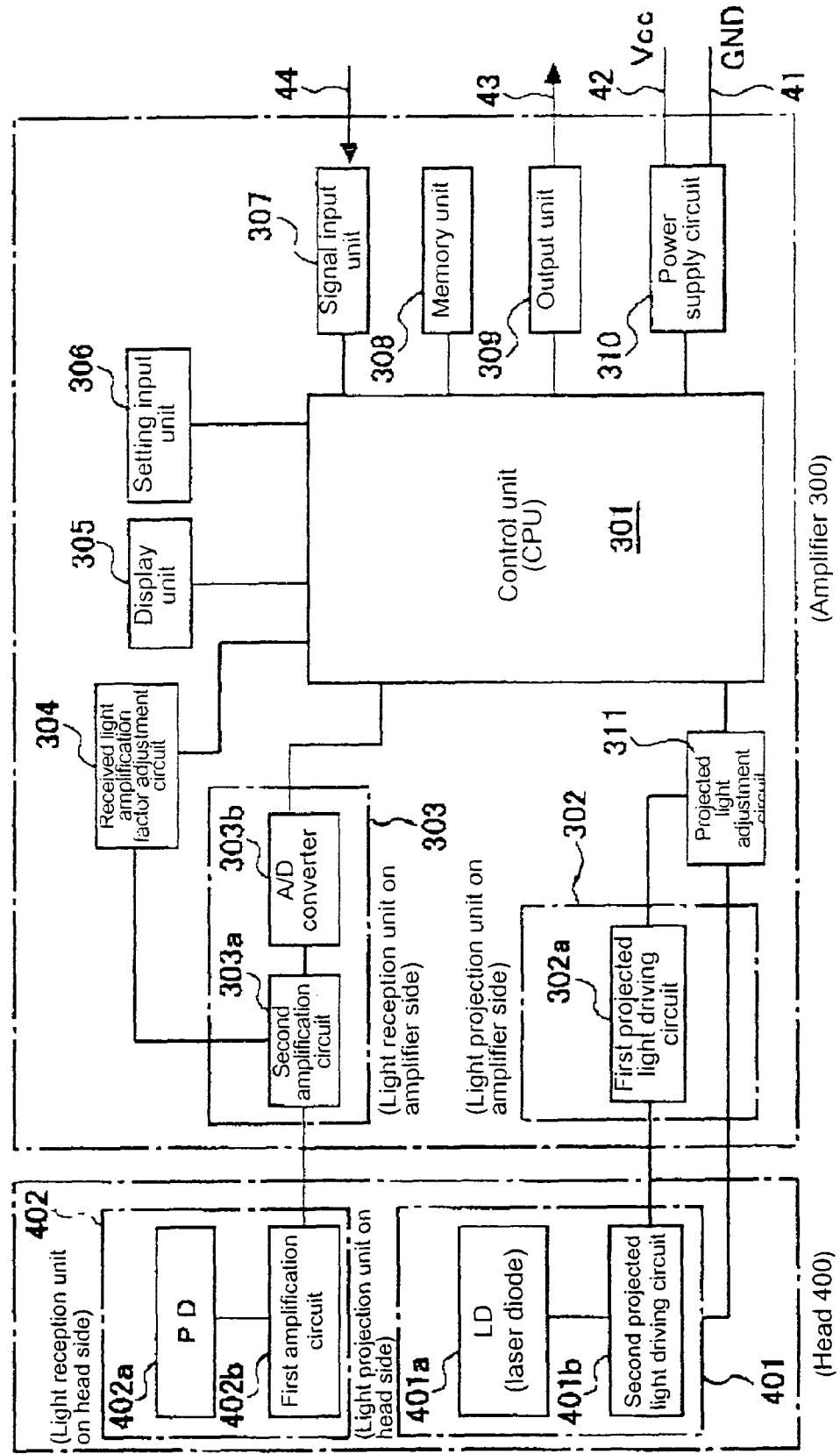
FIG. 14 is a block diagram showing an entire electric hardware configuration of an amplifier separation type photoelectric sensor that is an embodiment of the present invention.

Note that while in the embodiment described above, the present invention is implemented using a fiber type photoelectric sensor as shown in FIG. 3, a photoelectric sensor of the present invention can also effectively works in a case of an amplifier separation type photoelectric sensor as shown in FIG. 14.

That is, in the amplifier separation type photoelectric sensor shown in FIG. 14 is constructed of an amplifier 300 and a head 400. The amplifier 300 includes: a CPU 301 working as a control unit: a light projection unit 302 on the amplifier side; a light reception unit 303 on the amplifier side; a received light amplification factor adjustment circuit 304; a display unit 305; a setting input unit 306; a signal input unit 307; a memory unit 308; an output unit 309; a power supply circuit 310; and a projected light current adjustment circuit 311. On the other hand, the head 400 includes: a light projection unit 401 on the head side; and a light reception unit 402 on the head side.

In such a way, the amplifier separation type photoelectric sensor has the light projection unit 302 on the amplifier side and the light projection unit 401 on the head side, separated from each other. The light projection unit 302 on the amplifier side includes a first projected light driving circuit 302a and the light projection unit 401 on the head side includes: a laser diode (hereinafter, referred to as LD) which is a light emission element; and a second projected light driving circuit 401b. Pulse driving of the LD 401a is performed through the first projected light driving circuit 302a and the second projected light driving circuit 401b and adjustment of a projected light current in the first projected light driving circuit is simultaneously performed through the projected light current adjustment circuit 311.

On the other hand, an amplifier separation type photoelectric sensor also has the light reception unit 402 on the head side and the light reception unit 303 on the amplifier side, separated from each other. The light reception unit 402 on the head side includes: a PD 402a; and a first amplification circuit 402b, and the light reception unit 303 on the amplifier side includes: a second amplification circuit 303a; and an A/D converter 303b. A detected light amount value is captured into the CPU 301 through a first amplification circuit 402b, a second amplification circuit 303a and an A/D converter 303b and adjustment of a gain at that time is realized by adjusting an amplification factor of the second amplification circuit 303a on the side of the amplifier 300 side with the received light amplification factor adjustment circuit 304.

In such a configuration including the amplifier side and the head side as well, since a value of a detected "received light amount" is adjusted so as to coincide with a set "target value" in an automatic sensitivity adjusting process of the present invention, a detection operation can be performed on the side of a user with a sensitivity with which a detection value matched with a target value can be obtained in the final operating environment, even if the amplifier 300 and the head unit 400 are separately purchased.

Note that in the amplifier separation type photoelectric sensor shown in FIG. 14, not only is a detecting light projected directly to a detection region from the LD 401a, but a reflecting light from the detection region is also received directly in the PD 402a. The term "directly" means "not through a fiber", including a case where a light projecting lens and a light receiving lens are used in an optical system.

FIGS. 15A and 15B are representations for describing light amount values for the same detection target of a conventional scheme and a scheme of the present invention by comparison. Note that in this example, a case is considered where three fiber type photoelectric sensors are used in a transmission arrangement and work in the same detection target environment. Note that, in the figure, numerical references 11, 12, 21, 22, 31 and 32 indicate fiber heads.

In such a case in consideration, if characteristics of the three photoelectric sensors coincide with one another, a value of the light amount displayed on the first display has to coincide with those displayed on the other two units. Since in the fiber type, however, as described above, in addition to a variation in sensitivity due to a free combination between a fiber and an amplifier (an amplifier includes a light projection element and a light reception element), there are various causes for a variation among detection values originating in a disconnection condition of a fiber, a mounting condition of a fiber to the amplifier (an influence thereof is exerted on an optical coupling efficiency in coupling of a fiber with a light projection element and a light reception element) and a bending condition of a fiber; while in the transmission type, there are various causes for a variation among detection values originating in conducts of a user such as relative positions of a light projecting fiber and a light receiving fiber, it is impossible for a fabricator of photoelectric sensors to remove a variation among detection values in the same usage situation.

That is, in a case of a conventional scheme shown in FIG. 15A, values of the light amount values displayed on the first display are, for example, "1000" in Amplifier 1, "3000" in Amplifier 2 and "4000" for Amplifier 3, in which no coincidence in values is observed. Values of the light amount values displayed on the second display are, for example, "500" in Amplifier 1, "1500" in Amplifier 2 and "3000" for Amplifier 3, in which, inevitably, no coincidence in values is observed either. Therefore, in a system in which multiple amplifiers are arranged closely side by side, not only might a variation in displays in the same usage situation be a cause for a faithlessness of a user to the side of a maker but standardization in control of light amount values and threshold values cannot be realized on the side of a user either, which results in requirements for individually setting threshold values on products to degrade the products in handleability.

In contrast, since in a scheme of the present invention shown in FIG. 15B, by using the automatic sensitivity adjusting function described above, it is possible for an actual light amount value to be forcibly caused to coincide with a target value even if the actual light amount values of the amplifiers are different from one another; therefore, if the target value is "2000", light amount values displayed on the first displays arranged closely side by side of the amplifier coincide with one another as "2000", which enables threshold values displayed on the second displays to be the same value of "1000". Hence, since even in a case where multiple amplifiers are arranged closely side by side, display values coincide with one another, not only can a reliance of the side of a user be acquired on the side of a maker, but standardization of light mount values and threshold values can also be realized on the side of the user, which improves operability of a photoelectric sensor to a great level since no requirement arises for individual light amount value adjustment and threshold value adjustment especially on multiple photoelectric sensors which are applied in the same usage situation.

FIGS. 16A to 16C are representations showing light amount values obtained by a conventional scheme and a scheme of the present invention in a case where a small object carried on a conveyor is detected with two reflection type fiber sensors by comparison. An application is considered in which as shown in FIG. 16A, in a situation where small objects 502 and 502 are carried on a conveyor 501, the small objects 502 and 502 are detected with the two reflection type fiber sensors (Sensor A and Sensor B) right above the small objects 502 and 502. Note that in FIG. 16A, symbols A1 and B1 indicate fiber heads.

Since in this case, in the conventional scheme, as shown in FIG. 16B, it is hard for received light amounts of Sensor A and Sensor B to coincide with each other for various reasons described above, a requirement arises for individually setting threshold values on Sensor A and Sensor B.

On the other hand, since in a case where a scheme of the present invention is applied as shown in FIG. 16C, it is possible for Sensor A and Sensor B to coincide with each other in finally obtained light amount value using an automatic sensitivity adjusting function even in a case where actual detection light amounts are different from each other, it is only required to set a threshold value C common to both sensors, thereby enabling standardization of threshold values.

FIGS. 17A to 17C are representations showing light amount values obtained by a conventional scheme and a scheme of the present invention in a case where a liquid crystal substrate carried on a conveyor is detected with two transmission type fiber sensors by comparison. Note that in the FIG. 17A, symbols A1, A2, B1 and B2 indicate fiber heads.

An application is considered in which as shown in FIG. 16A, in a situation where a liquid crystal substrate 503 is transported in a direction shown by an arrow 504, a pair of fiber heads (A1 and A2) and a pair of fiber heads (B1 and B2) are positioned so that the fiber heads of each pair faces each other while the liquid crystal substrate 503 is interposed between the fiber heads of each pair, wherein detection is performed by the two sensors (Sensor A and Sensor B).

Since in the conventional scheme, as shown in FIG. 17B, it is hard for both Sensors A and B to coincide with each other in light amount value, a requirement arises for individually setting threshold values on Sensor A and Sensor B, which is similar to the case of the reflection type. In contrast to this, since in a scheme of the present invention, as shown in FIG. 17C, by using an automatic sensitivity adjusting process even in a case where actual light amounts are different from each other, it is possible for Sensor A and Sensor B to coincide with each other in detected light amount; therefore, a threshold value common to both sensors can be used, which makes possible standardization of threshold values and facilitation in individual setting operations, thereby enabling great improvement on handleability.

The present invention, as is clear in the above description, has an effect that it is easy to adjust plural photoelectric sensors so as to have similar detection characteristics and an evaluation reference for a detection value such as a threshold value is also easy to be set in a case where a single photoelectric sensor is used alone.

What is claimed is:

1. A photoelectric sensor comprising:
   a light projection unit having a light emission element for emitting detecting tight to a detection region;
   a light reception unit having a light reception element for receiving light from the detection region to obtain a detection value corresponding to an amount of received light;
   a target value storage unit for storing an adjustment target value for the detection value;
   sensitivity adjustment means for adjusting at least one of a power of the detection light emitted from the light projection unit and a conversion factor for the light received by the light reception unit, so as to match the detection value with the target value;
   adjustment instruction means for instructing execution of adjustment to the sensitivity adjusting means;
   threshold value setting means for selecting a threshold value; and
   comparison means for comparing the threshold value with the detection value.

2. A photoelectric sensor according to claim 1, comprising a separation type amplifier.

3. A photoelectric sensor according to claim 1 comprising a fiber type amplifier.

4. The photoelectric sensor according to claim 3, wherein the target value is set in the middle portion of one third of a range of detection values after sensitivity adjustment, whereby the target value can be used in common with transmission type and reflection type fiber type sensor arrangements.

5. The photoelectric sensor according to claim 1, further comprising: output means for outputting the detection value as an analog signal such as a voltage value or a current value or, alternatively, as a signal showing a digitized numerical value.

6. The photoelectric sensor according to claim 1, wherein the threshold value setting means is used for manual setting, the photoelectric sensor further comprising display means for numerically displaying the threshold value.

7. The photoelectric sensor according to claim 1, wherein the threshold value setting means is used for selecting one of plural threshold values prepared for use in advance, the photoelectric sensor further comprising display means for displaying which one of the plural threshold values is selected.

8. The photoelectric sensor according to claim 1, further comprising: target value change means.

9. An adjustment method for a photoelectric sensor, comprising the steps of:
   performing sensitivity adjustment in a state where no object exists using the photoelectric sensor according to claim 1; and
   performing threshold value setting so that a threshold value takes a predetermined value after execution of the sensitivity adjustment.

10. An adjustment method for a photoelectric sensor, comprising the steps of:
    installing plural photoelectric sensors according to claim 1 in a predetermined usage situation;
    performing sensitivity adjustment on the plural photoelectric sensors in a state where no detection object exists; and
    performing threshold value setting on the plural photoelectric sensors so that all of threshold values of the plural photoelectric sensors takes the same predetermined value after execution of sensitivity adjustment.

11. A photoelectric sensor arrangement comprising:
    a plurality of photoelectric sensors each comprising:
       a light projection unit having a light emission element for emitting detecting light;
       a light reception unit having a light reception element for receiving reflected detecting light and configured to produce a detection value corresponding to an amount of reflected detection light which is received;
       a target value storage unit for storing an adjustment target value for the detection value;
       sensitivity adjustment means for adjusting at least one of a power of the detection light emitted from the light projection unit and a conversion factor of the reflected detection light received by the light reception unit, to the detection value, so as to match the detection value with the target value;
       adjustment instruction means for instructing execution of adjustment to the sensitivity adjusting means;
    a selected one of the plurality of photoelectric sensors having:
       threshold value setting means for setting a threshold value; and
       comparison means for comparing the threshold value with the detection value.

* * * * *